(12) United States Patent
Togashi et al.

(10) Patent No.: US 10,453,882 B2
(45) Date of Patent: Oct. 22, 2019

(54) SOLID-STATE IMAGING DEVICE, METHOD OF MANUFACTURING SOLID-STATE IMAGING DEVICE, AND ELECTRONIC APPARATUS

(71) Applicant: SONY SEMICONDUCTOR SOLUTIONS CORPORATION, Kanagawa (JP)

(72) Inventors: Hideaki Togashi, Kanagawa (JP); Naoyuki Sato, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 75 days.

(21) Appl. No.: 15/882,591

(22) Filed: Jan. 29, 2018

(65) Prior Publication Data
US 2018/0226444 A1   Aug. 9, 2018

Related U.S. Application Data

(63) Continuation of application No. 14/409,707, filed as application No. PCT/JP2013/066708 on Jun. 18, 2013, now Pat. No. 9,911,772.

(30) Foreign Application Priority Data

Jun. 29, 2012   (JP) .................................. 2012-146499

(51) Int. Cl.
| | |
|---|---|
| H01L 27/146 | (2006.01) |
| H04N 5/361 | (2011.01) |
| H04N 5/378 | (2011.01) |

(52) U.S. Cl.
CPC .... *H01L 27/14621* (2013.01); *H01L 27/1464* (2013.01); *H01L 27/14605* (2013.01); *H01L 27/14609* (2013.01); *H01L 27/14623* (2013.01); *H01L 27/14636* (2013.01); *H01L 27/14647* (2013.01); *H04N 5/361* (2013.01); *H04N 5/378* (2013.01)

(58) Field of Classification Search
CPC ......... H01L 27/14621; H01L 27/14623; H01L 27/14609; H01L 27/14605; H01L 27/14647; H01L 27/1464; H01L 27/14636; H04N 5/378; H04N 5/361
USPC ...................................... 250/208.1
See application file for complete search history.

(56) References Cited

U.S. PATENT DOCUMENTS

| | | | |
|---|---|---|---|
| 7,271,462 B2 * | 9/2007 | Satoru ............... | H01L 27/14643 257/215 |
| 7,993,951 B2 * | 8/2011 | Okabe ............... | H01L 21/28518 257/E31.052 |

* cited by examiner

*Primary Examiner* — Seung C Sohn
(74) *Attorney, Agent, or Firm* — Sheridan Ross P.C.

(57) ABSTRACT

A solid-state imaging device according to the present disclosure includes: a semiconductor base; a photoelectric conversion element provided in the semiconductor base; a photoelectric conversion film arranged on a light receiving surface side of the semiconductor base; a contact section to which a signal charge generated in the photoelectric conversion film is read, the contact section being provided in the semiconductor base; a first film member covering the photoelectric conversion element; and a second film member provided on the contact section.

12 Claims, 20 Drawing Sheets

[ FIG. 1 ]
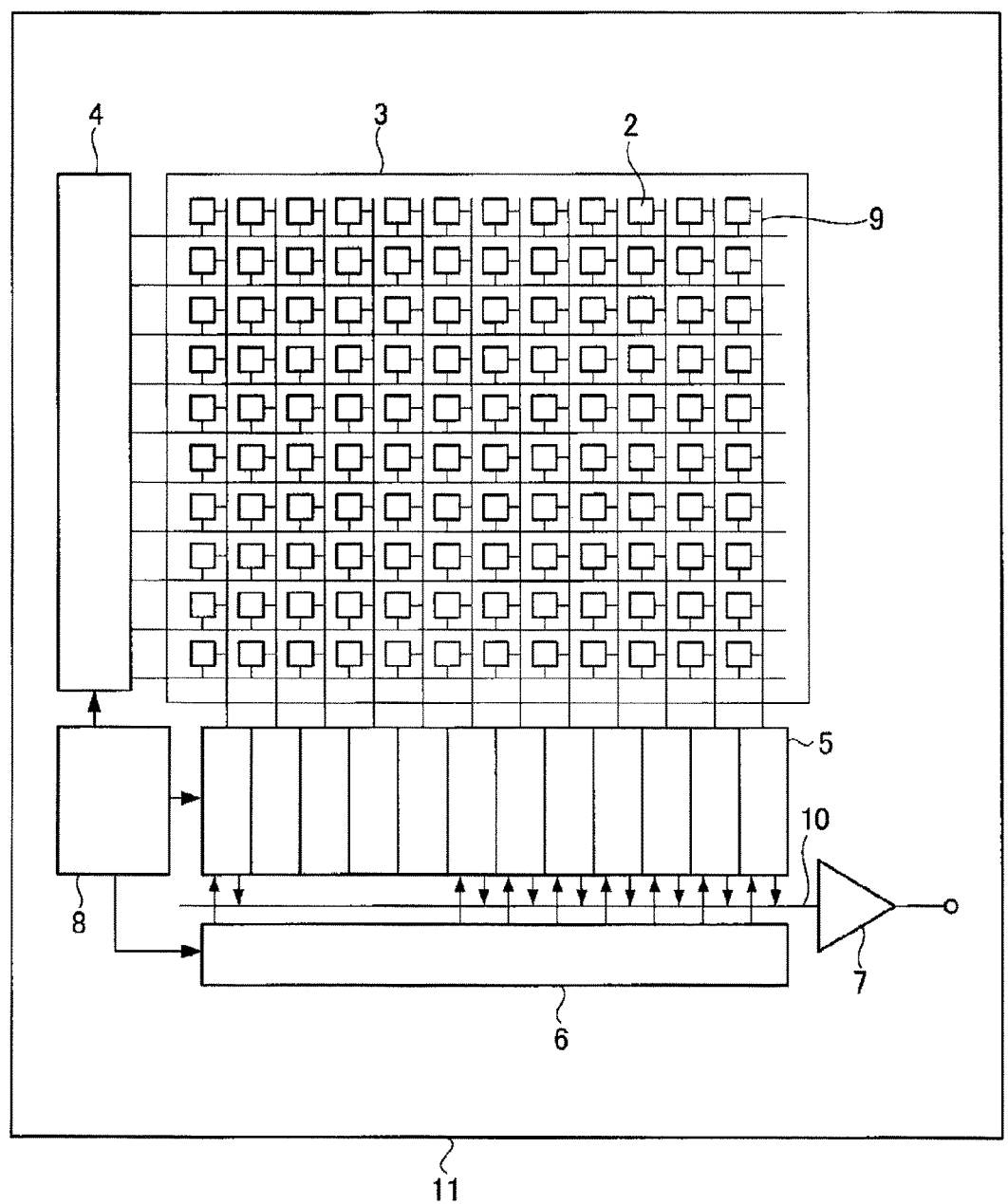

[FIG. 2]
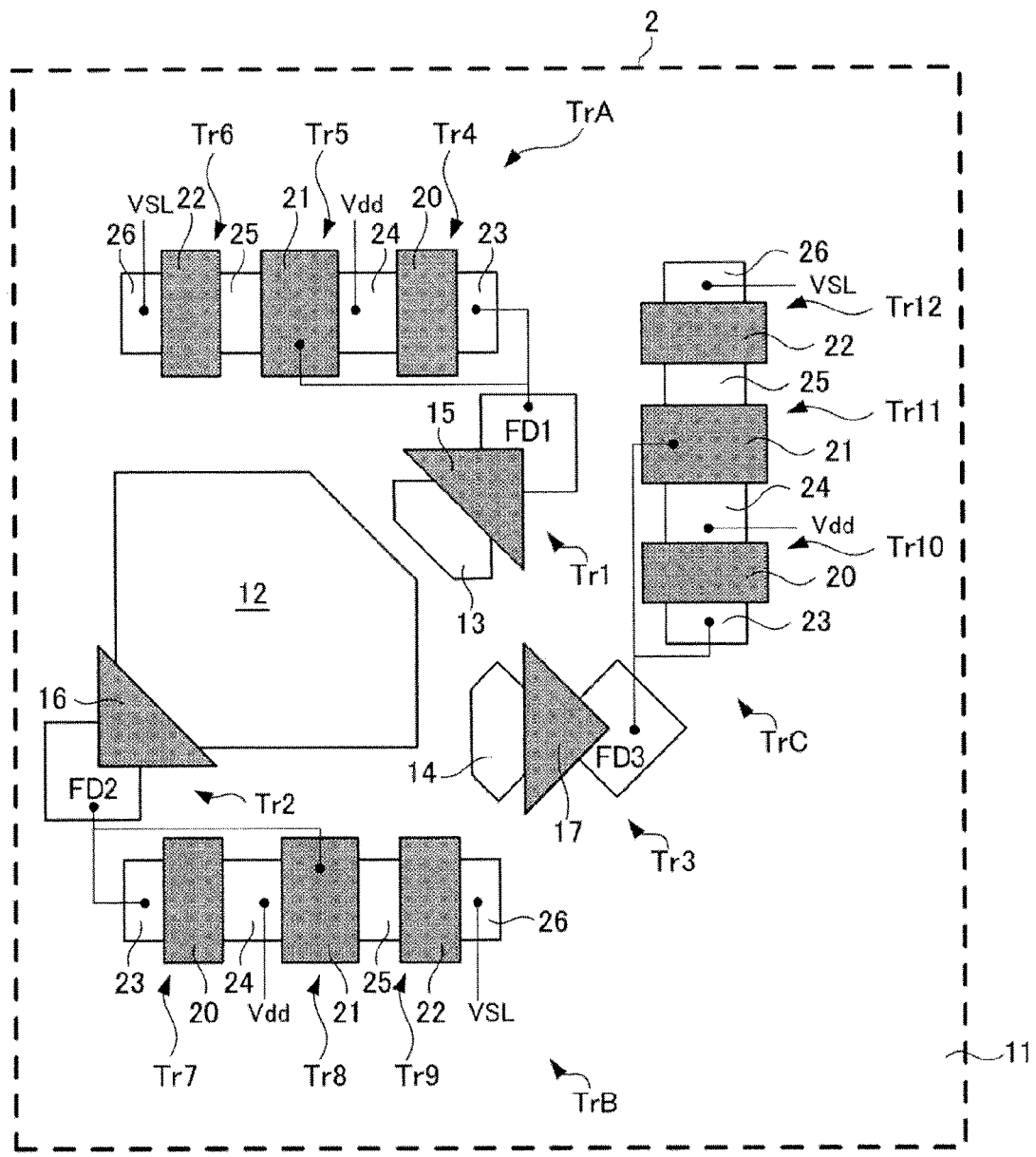

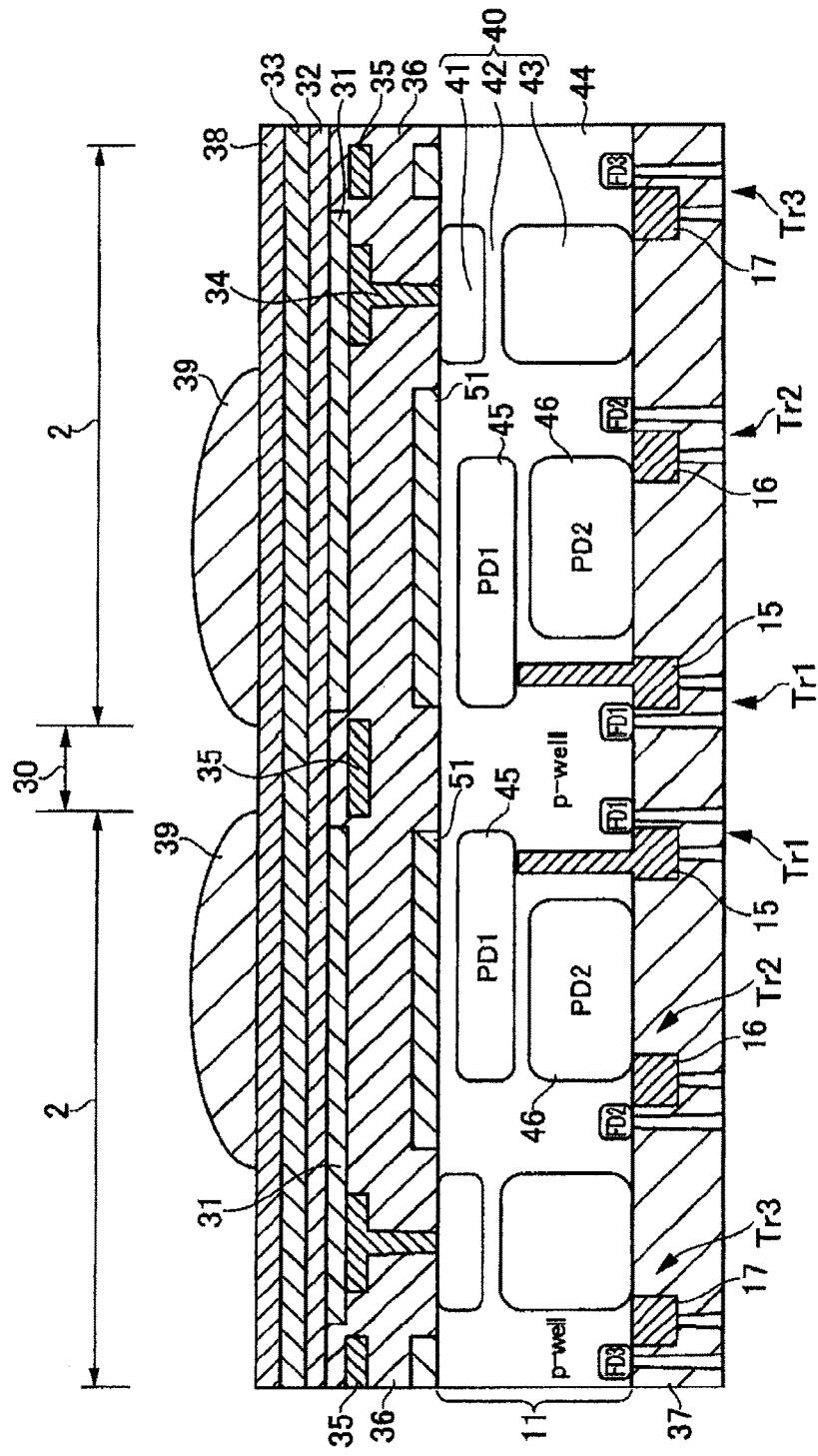
[FIG. 3]

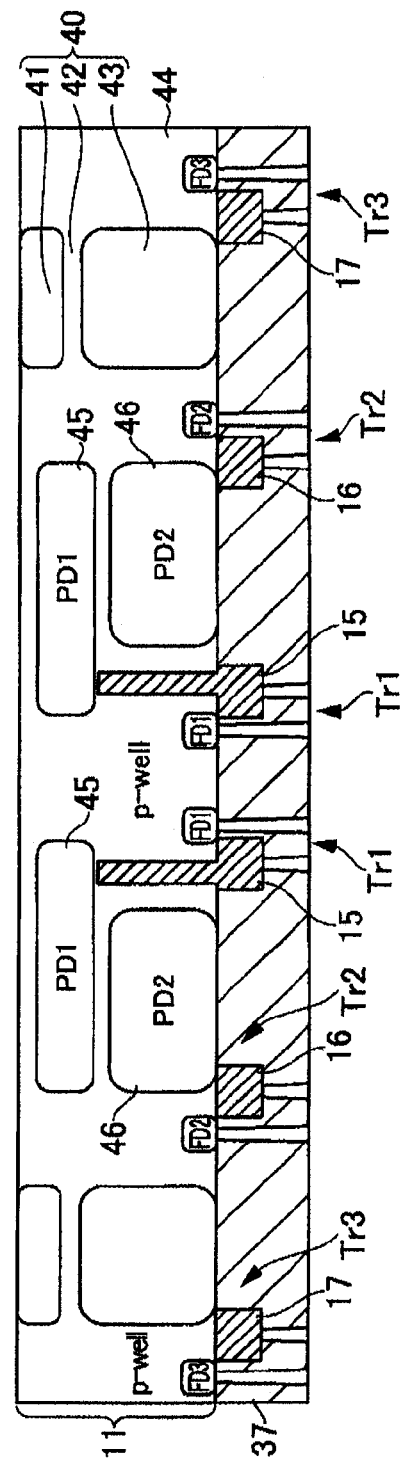
[FIG. 4]

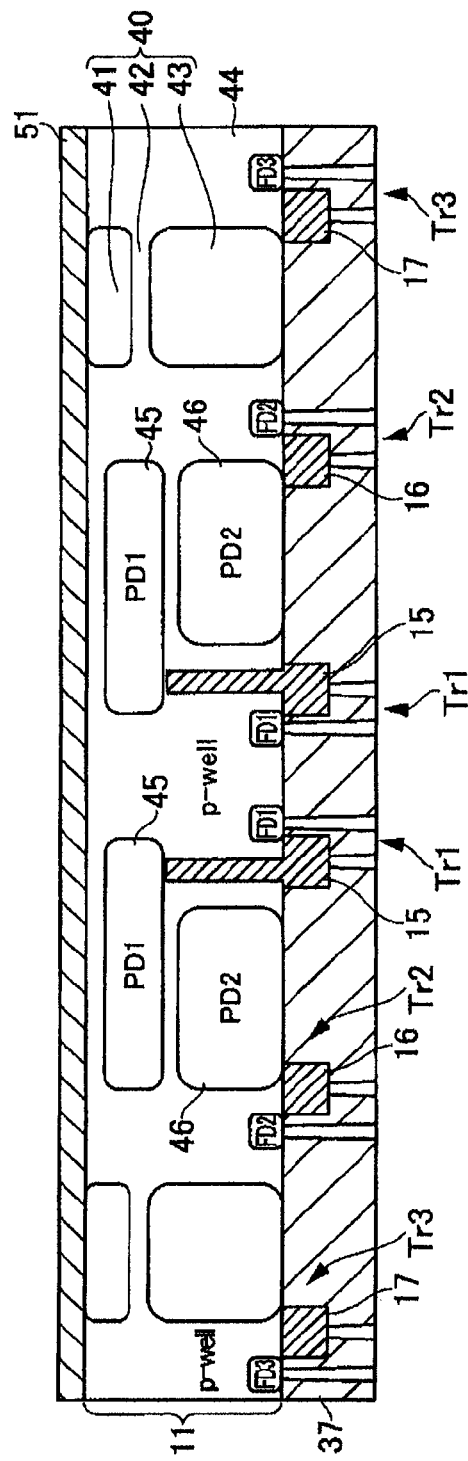
[FIG. 5]

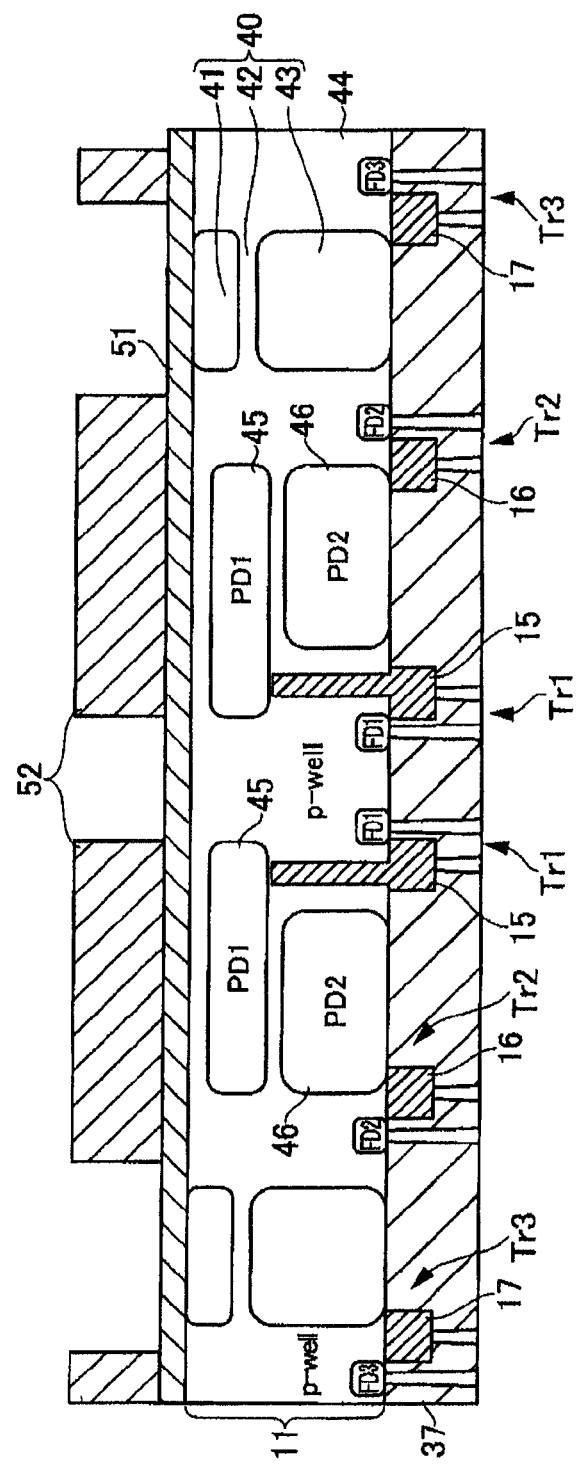
[FIG. 6]

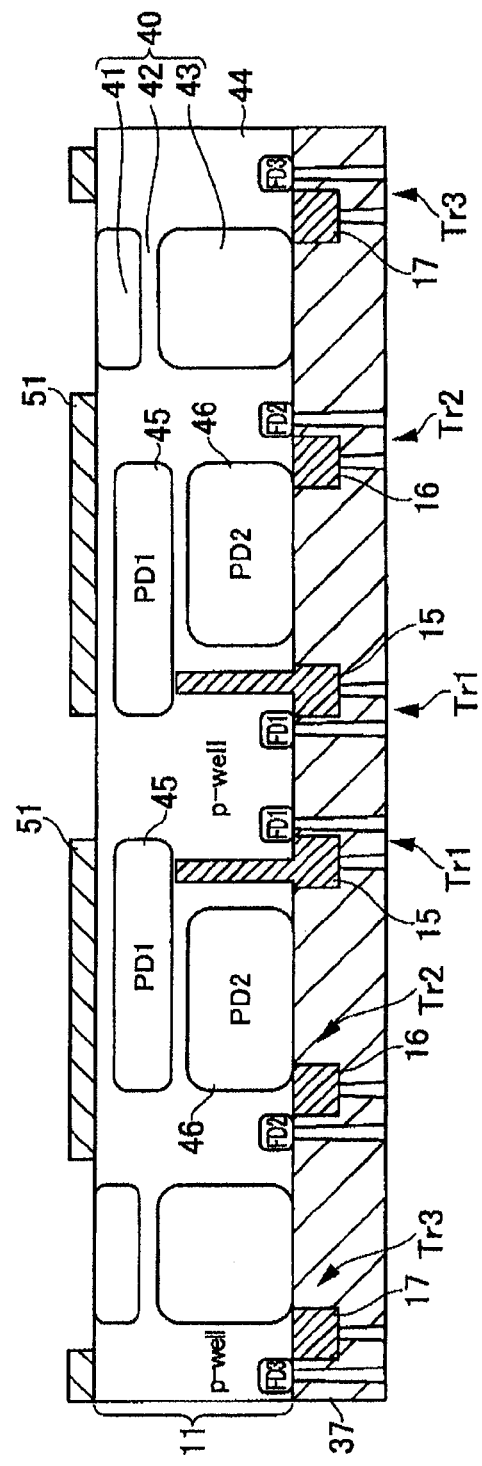
[ FIG. 7 ]

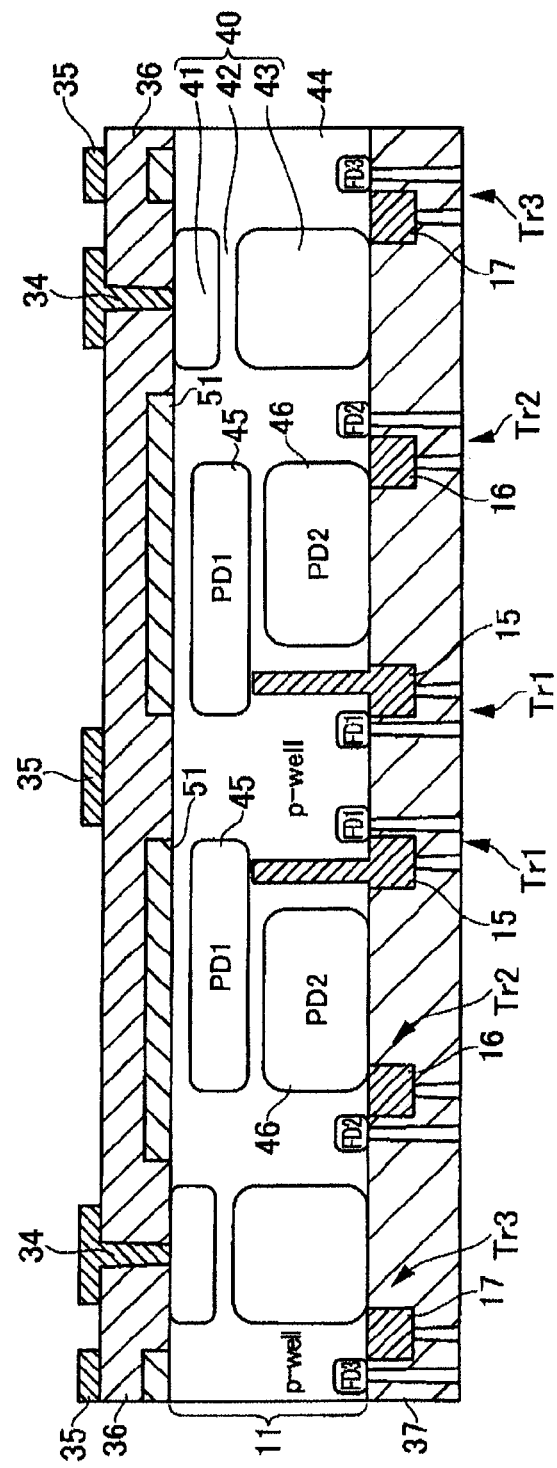
[FIG. 8]

[FIG. 9]
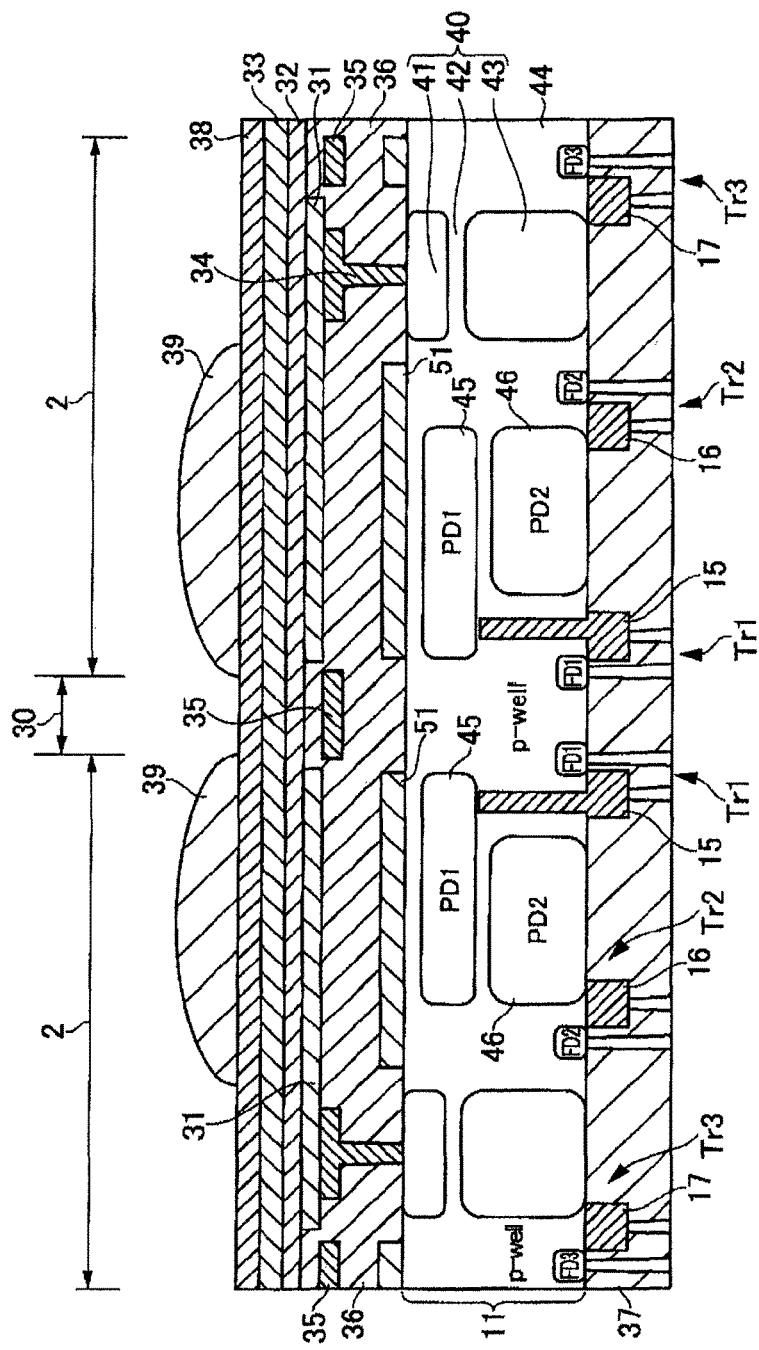

[ FIG. 10 ]
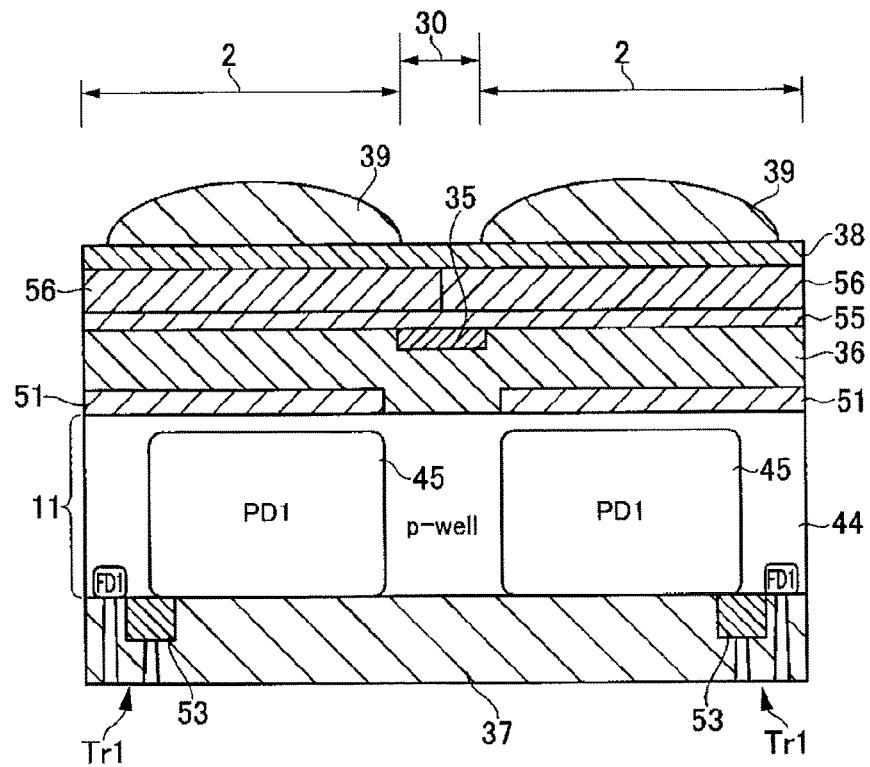
[ FIG. 11 ]
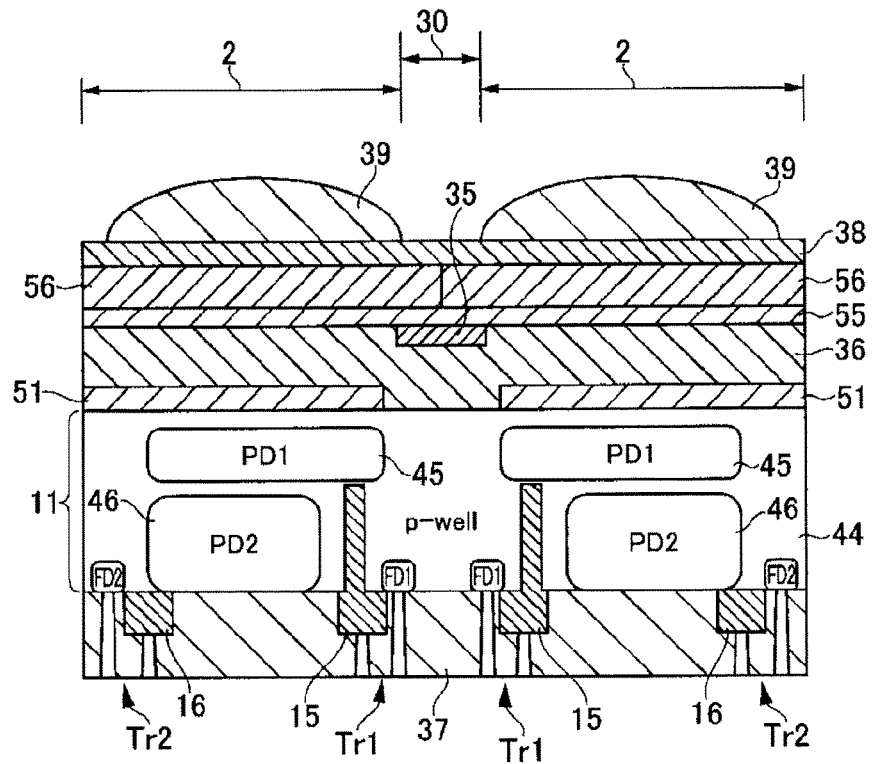

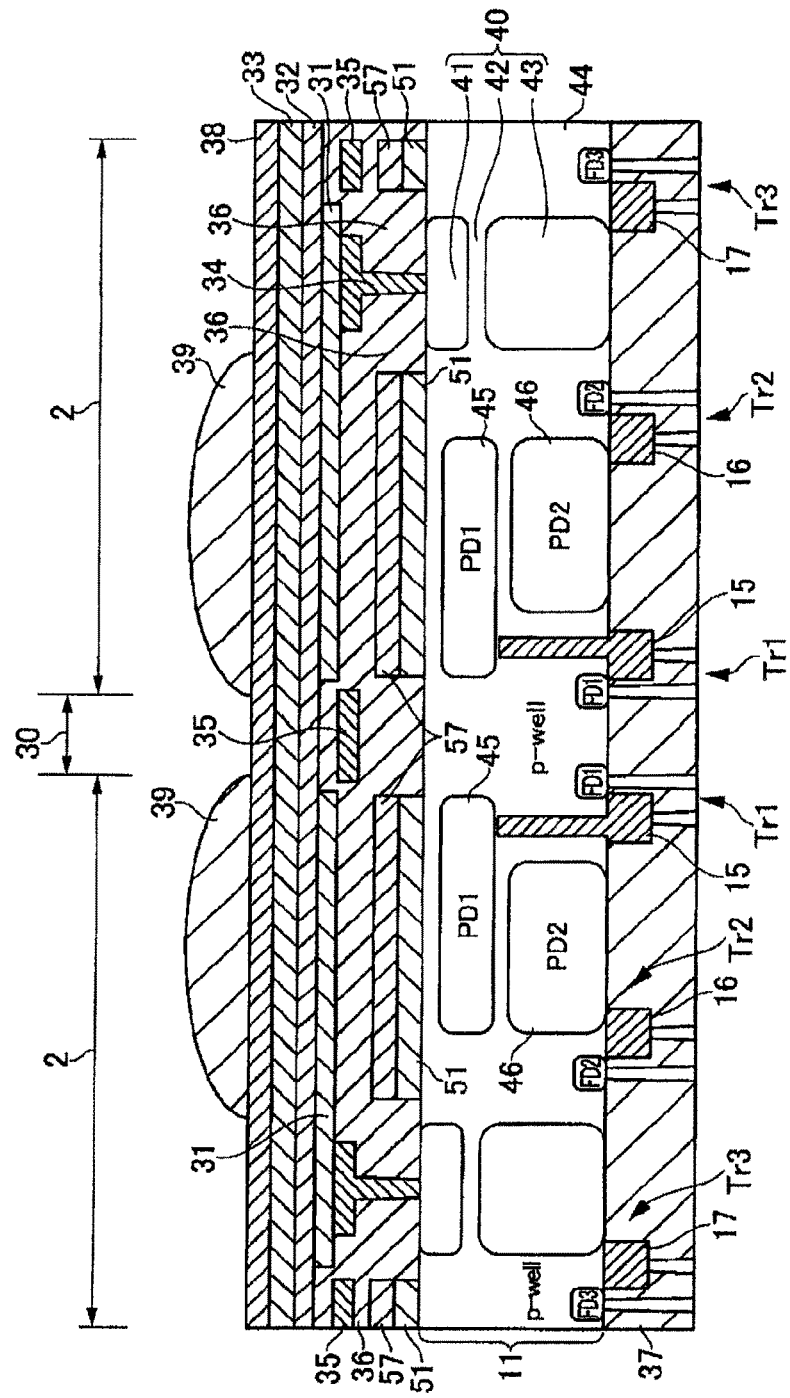
[ FIG.12 ]

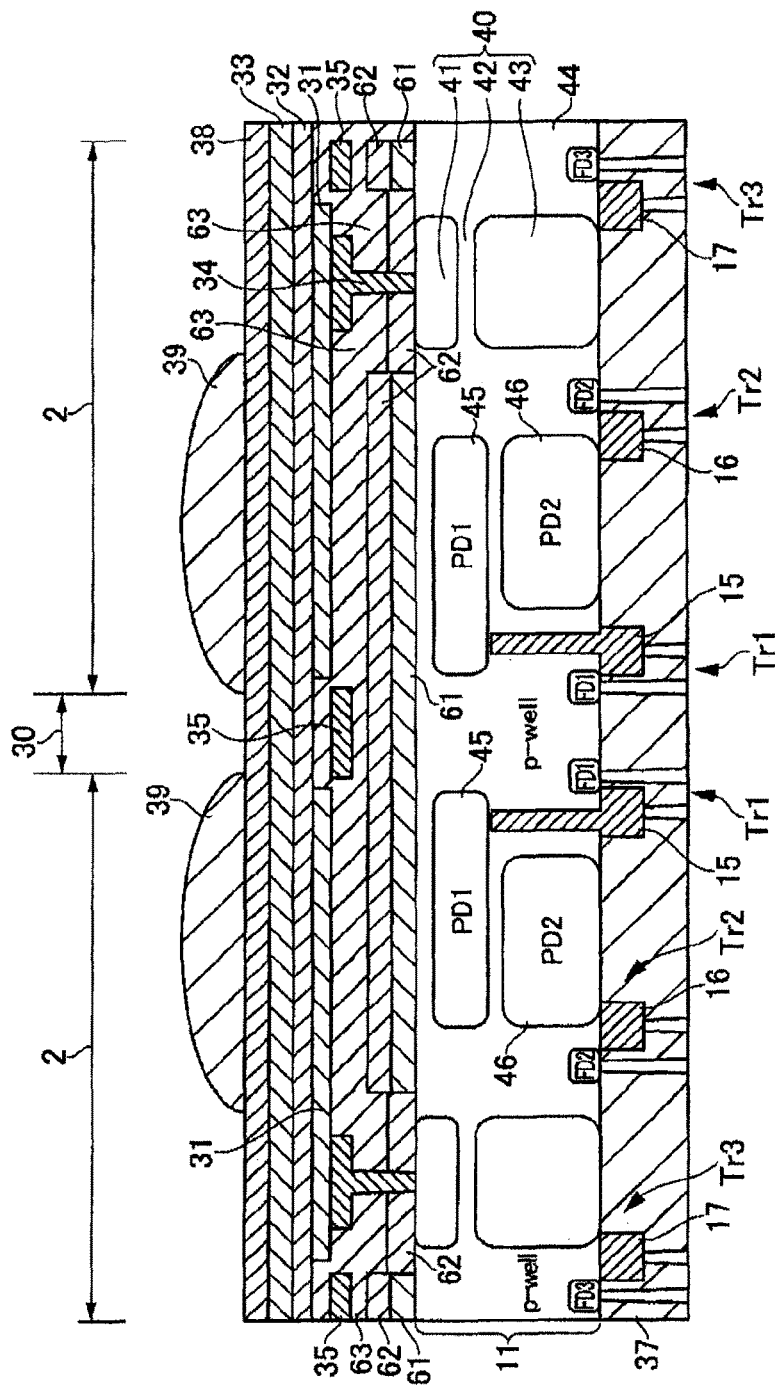
[FIG. 13]

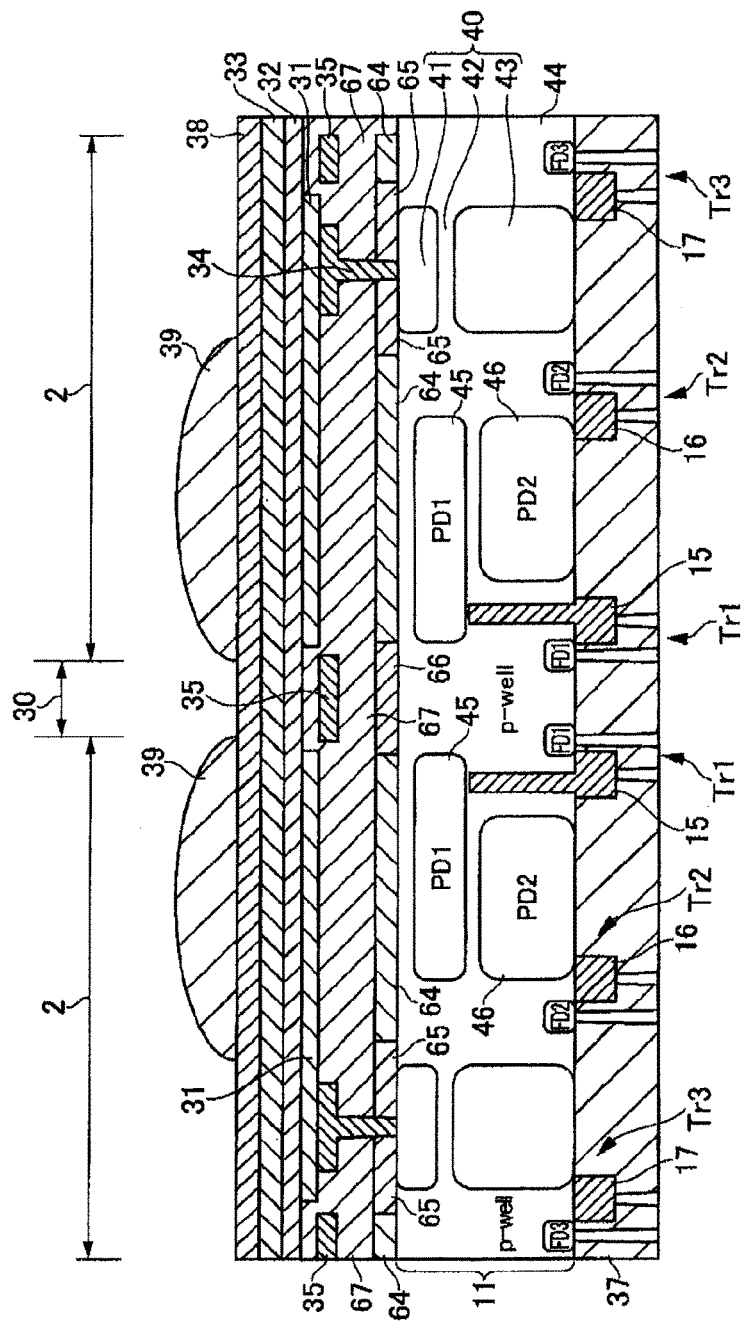
[FIG. 14]

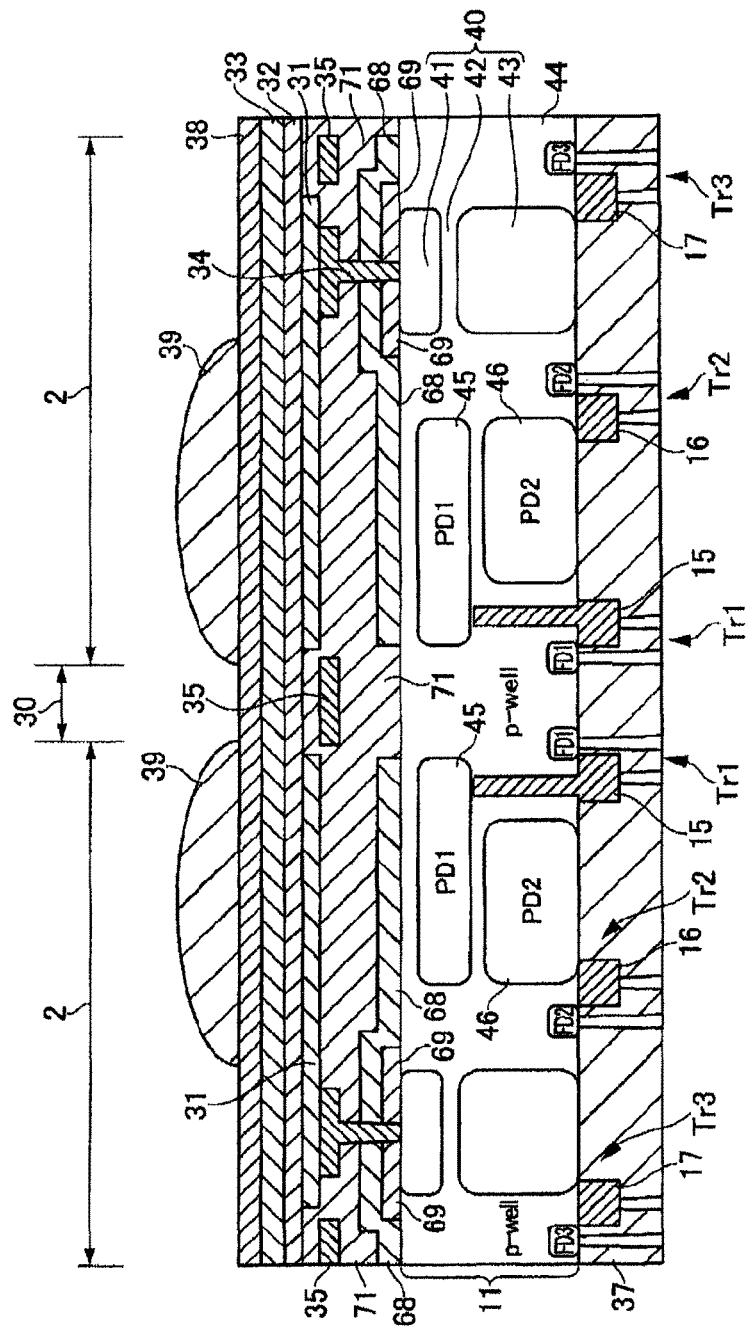
[FIG. 15]

[FIG. 16]
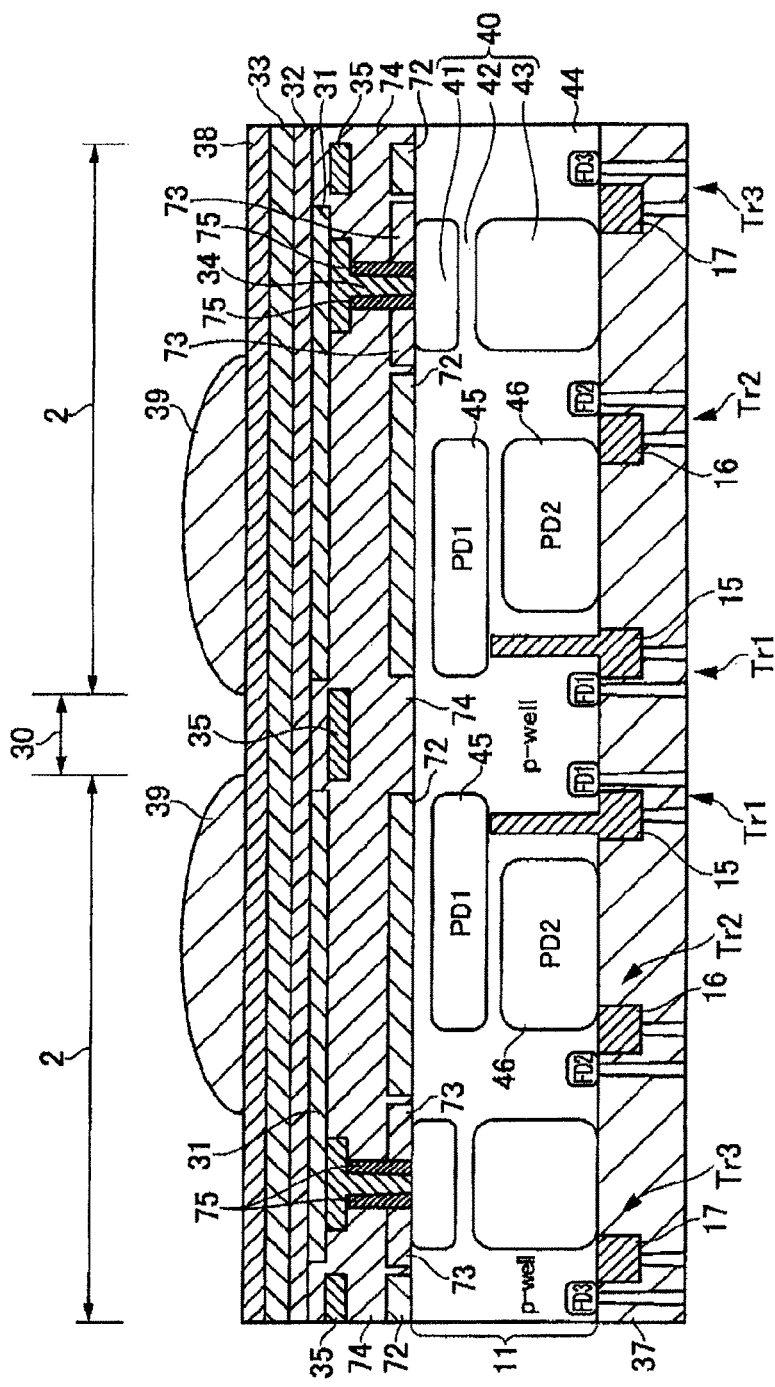

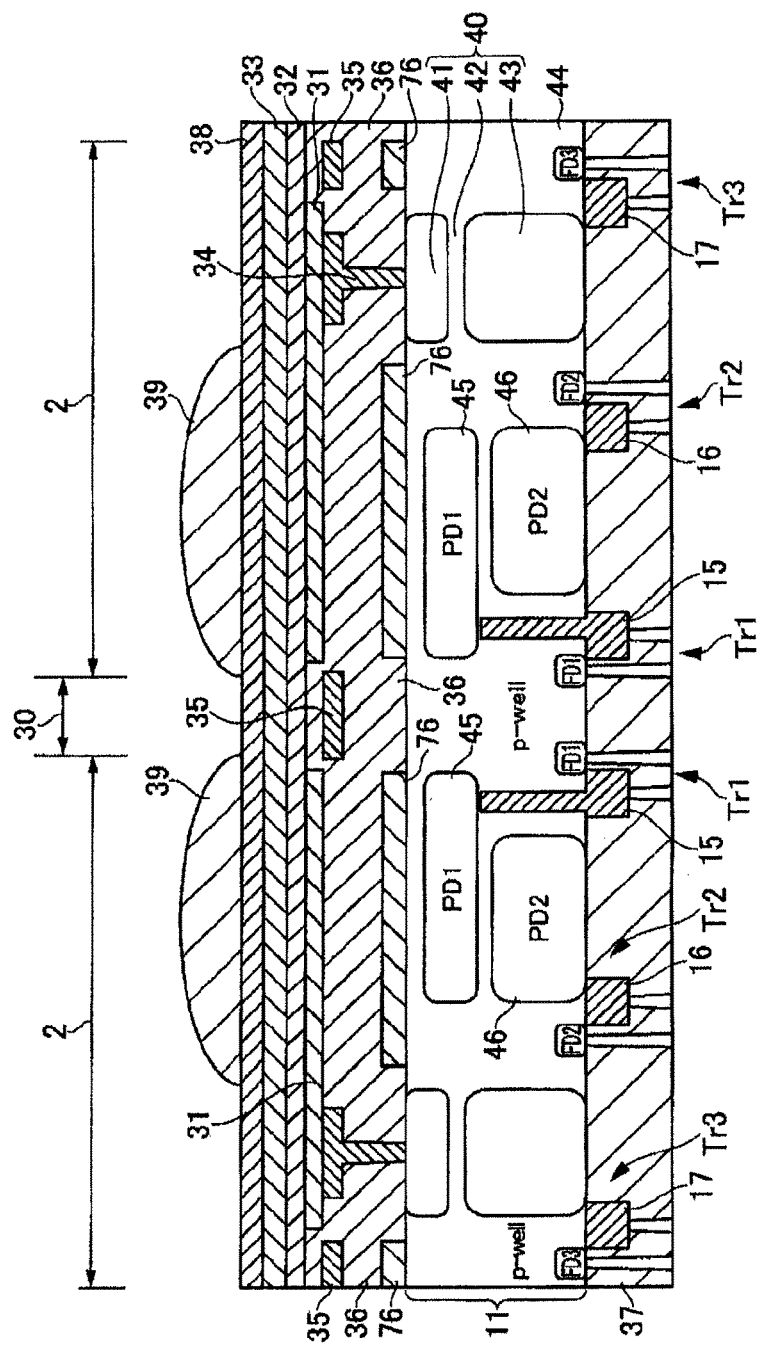
[FIG. 17]

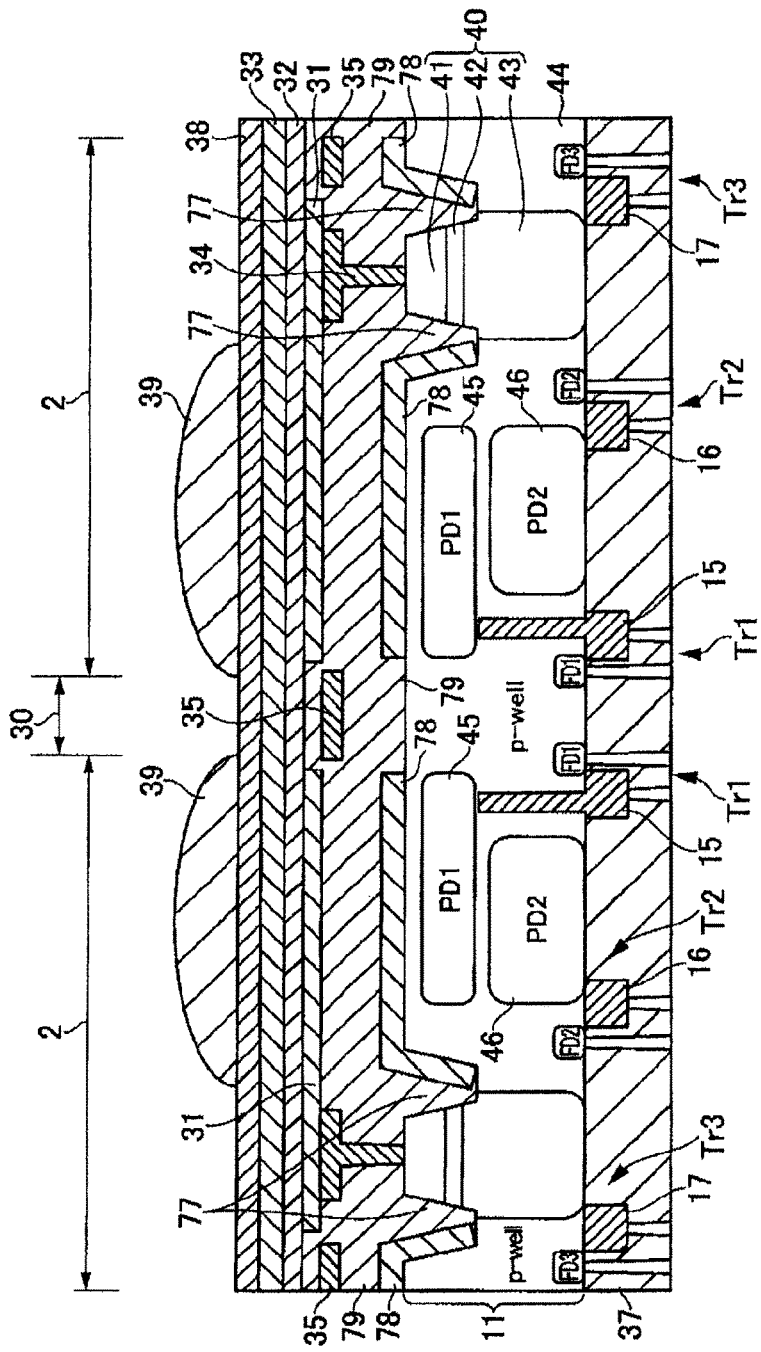
[FIG. 18]

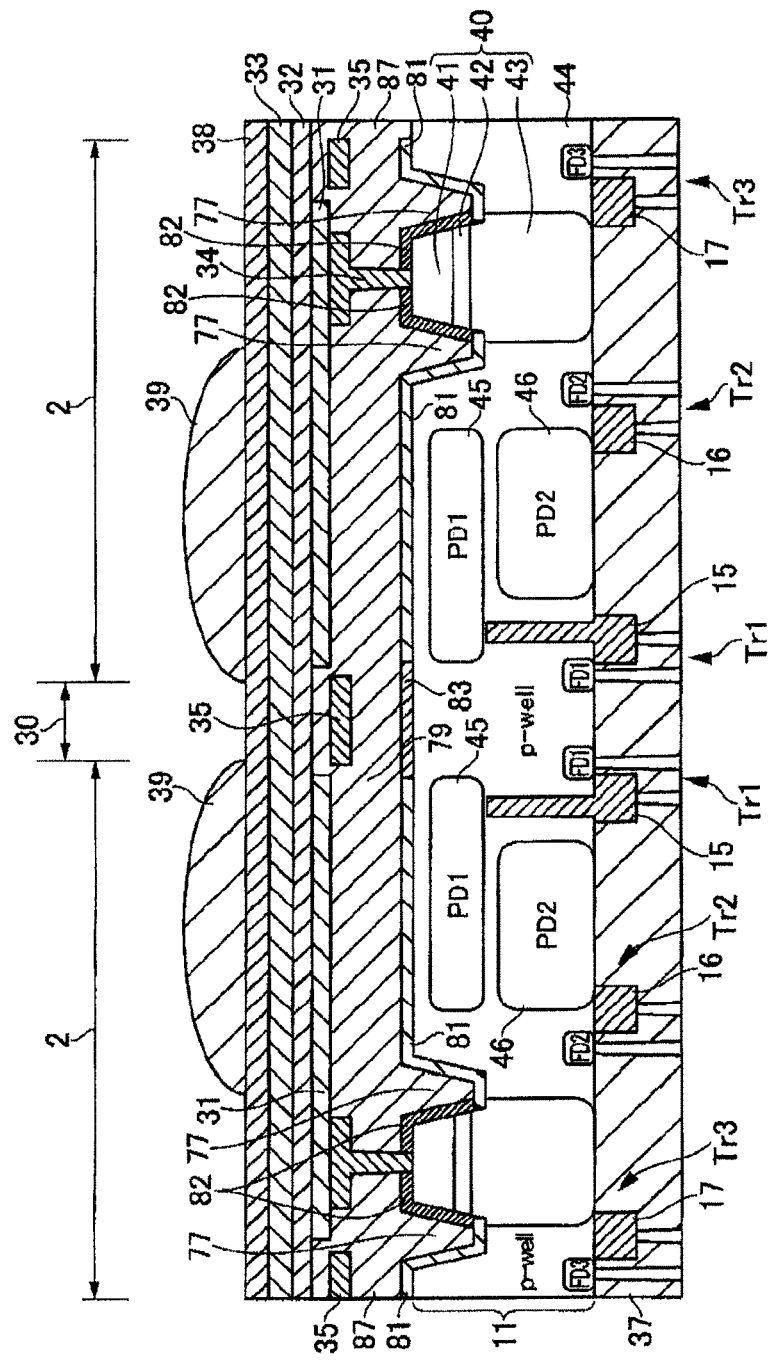
[FIG. 19]

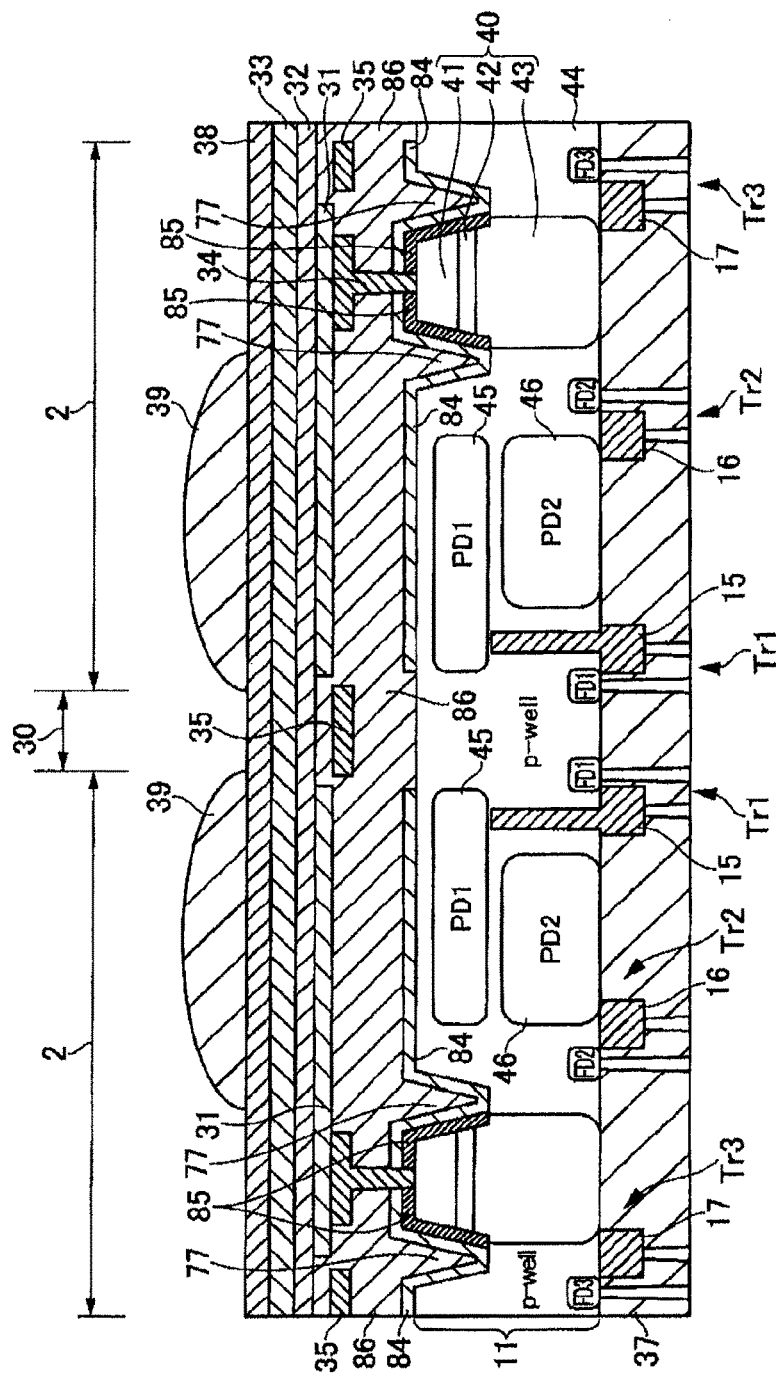
[FIG.20]

[ FIG. 21 ]
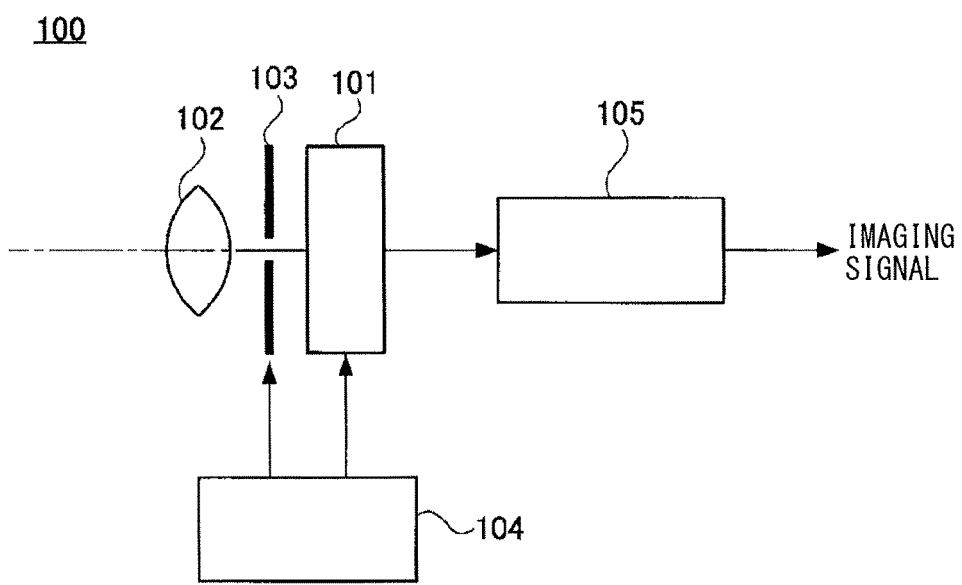

SOLID-STATE IMAGING DEVICE, METHOD OF MANUFACTURING SOLID-STATE IMAGING DEVICE, AND ELECTRONIC APPARATUS

CROSS REFERENCE TO RELATED APPLICATIONS

This application is a continuation of U.S. patent application Ser. No. 14/409,707, filed Dec. 19, 2014, which is a national stage application under 35 U.S.C. 371 and claims the benefit of PCT Application No. PCT/JP2013/066708 having an international filing date of Jun. 18, 2013, which designated the United States, which PCT application claimed the benefit of Japanese Patent Application No. 2012-146499 filed Jun. 29, 2012, the entire disclosures of which are incorporated herein by reference.

TECHNICAL FIELD

The present technology relates to a solid-state imaging device, to a method of manufacturing a solid-state imaging device, and to an electronic apparatus.

BACKGROUND ART

For a back-illumination-type solid-state imaging device, there is proposed to form a film having a negative fixed charge on a surface of a semiconductor base in order to suppress generation of dark current that results from an interface state of the semiconductor base on a second surface side which light enters (for example, see Patent Literature 1). Due to an electric filed induced by the film having the negative fixed charge, a hole accumulation (hole accumulation) layer is formed on an interface, of a light receiving section, on a light receiving surface side. Generation of an electron from the interface is suppressed by this hole accumulation layer. Also when a charge (an electron) is generated from the interface, the electron demises in the hole accumulation layer in the way of diffusion, and dark current is therefore allowed to be reduced.

Moreover, when this film having the negative fixed charge is formed on the entire pixel region section and the entire peripheral circuit section, on the second surface side of the semiconductor base, in the back-illumination-type solid-state imaging device, a potential difference is generated between the device on a first surface side of the peripheral circuit side and the second surface side of the semiconductor base. In this case, an unexpected carrier flows from the semiconductor interface on the second surface side into the device on the first surface side, which causes malfunction of a circuit. Accordingly, in order to avoid this malfunction, it is proposed to change a thickness of an insulating film that is formed between the film having the negative fixed charge and the semiconductor base in the pixel section and the peripheral circuit section (for example, see Patent Literature 2). For example, it is proposed to form, in the peripheral circuit section, the insulating film so that a distance from the film having the negative fixed charge to the first surface side of a semiconductor layer is longer than that in the pixel section.

CITATION LIST

Patent Literature

Patent Literature 1: Japanese Unexamined Patent Application Publication No. 2008-306154

Patent Literature 2: Japanese Unexamined Patent Application Publication No. 2010-226143

SUMMARY OF THE INVENTION

As described above, for a back-illumination-type solid-state imaging device, it is demanded to improve imaging characteristics of the solid-state imaging device by preventing generation of dark current or generation of unexpected carrier in a semiconductor base interface.

Accordingly, it is desirable to provide a solid-state imaging device and an electronic apparatus that are capable of improving imaging characteristics.

A solid-state imaging device of an embodiment of the present technology includes: a semiconductor base; a photoelectric conversion element provided in the semiconductor base; and a photoelectric conversion film arranged on a light receiving surface side of the semiconductor base. Further, the solid-state imaging device includes: a contact section to which a signal charge generated in the photoelectric conversion film is read and that is provided in the semiconductor base; a first film member covering the photoelectric conversion element; and a second film member provided on the contact section.

Moreover, a solid-state imaging device of an embodiment of the present technology includes: a semiconductor base; a photoelectric conversion element provided in the semiconductor base; a first film member provided on the photoelectric conversion element; and the second film member provided on the semiconductor base in an inter-pixel region between the photoelectric conversion elements adjacent to each other.

Moreover, an electronic apparatus of an embodiment of the present technology includes the above-described solid-state imaging device, and a signal processing circuit configured to process an output signal of the solid-state imaging device.

A method of manufacturing a solid-state imaging device of an embodiment of the present technology includes a step of forming a photoelectric conversion element and a contact section in a semiconductor base. Further, the method includes: a step of forming a first film member on the semiconductor base at a position that covers the photoelectric conversion element; a step of forming a second film member on the semiconductor base at a position that covers the contact section; and a step of forming a photoelectric conversion film on a light receiving surface of the semiconductor base.

According to the solid-state imaging device of the embodiment of the present technology and according to a solid-state imaging device manufactured by the manufacturing method thereof, the first film member is formed on the photoelectric conversion element, and the second film member is formed on the contact section. Alternatively, the first film member is formed on the photoelectric conversion element, and the second film member is formed in the inter-pixel region. Accordingly, by selectively forming, on the photoelectric conversion element and on the contact section or in the inter-pixel region, film members made of material suitable for characteristics of the respective portions, it is possible to prevent generation of dark current in the semiconductor base interface. As a result, it is possible to improve imaging characteristics of the solid-state imaging device.

According to an embodiment of the present technology, it is possible to provide the solid-state imaging device and the electronic apparatus that are capable of improving imaging characteristics.

BRIEF DESCRIPTION OF THE DRAWINGS

FIG. 1 is a planar view illustrating a configuration of a solid-state imaging device of a first embodiment.

FIG. 2 is a planar view illustrating a schematic planar configuration of the solid-state imaging device of the first embodiment.

FIG. 3 is a cross-sectional view illustrating a configuration of the solid-state imaging device of the first embodiment.

FIG. 4 is a manufacturing step diagram of the solid-state imaging device of the first embodiment.

FIG. 5 is a manufacturing step diagram of the solid-state imaging device of the first embodiment.

FIG. 6 is a manufacturing step diagram of the solid-state imaging device of the first embodiment.

FIG. 7 is a manufacturing step diagram of the solid-state imaging device of the first embodiment.

FIG. 8 is a manufacturing step diagram of the solid-state imaging device of the first embodiment.

FIG. 9 is a manufacturing step diagram of the solid-state imaging device of the first embodiment.

FIG. 10 is a cross-sectional view illustrating a configuration of a solid-state imaging device of a second embodiment.

FIG. 11 is a cross-sectional view illustrating a configuration of a solid-state imaging device of a modification of the second embodiment.

FIG. 12 is a cross-sectional view illustrating a configuration of a solid-state imaging device of a third embodiment.

FIG. 13 is a cross-sectional view illustrating a configuration of a solid-state imaging device of a fourth embodiment.

FIG. 14 is a cross-sectional view illustrating a configuration of a solid-state imaging device of a fifth embodiment.

FIG. 15 is a cross-sectional view illustrating a configuration of a solid-state imaging device of a sixth embodiment.

FIG. 16 is a cross-sectional view illustrating a configuration of a solid-state imaging device of a seventh embodiment.

FIG. 17 is a cross-sectional view illustrating a configuration of a solid-state imaging device of an eighth embodiment.

FIG. 18 is a cross-sectional view illustrating a configuration of a solid-state imaging device of a ninth embodiment.

FIG. 19 is a cross-sectional view illustrating a configuration of a solid-state imaging device of a tenth embodiment.

FIG. 20 is a cross-sectional view illustrating a configuration of a solid-state imaging device of an eleventh embodiment.

FIG. 21 is a diagram illustrating a configuration of an electronic apparatus.

MODES FOR CARRYING OUT THE INVENTION

Examples of a best mode for carrying out the present technology is described below. However, the present technology is not limited to the examples below.

It is to be noted that the description is provided in the following order.

1. Summary of Solid-state Imaging Device
2. First Embodiment of Solid-state Imaging Device
3. Method of Manufacturing Semiconductor Unit of First Embodiment
4. Second Embodiment of Solid-state Imaging Device
5. Third Embodiment of Solid-state Imaging Device
6. Fourth Embodiment of Solid-state Imaging Device
7. Fifth Embodiment of Solid-state Imaging Device
8. Sixth Embodiment of Solid-state Imaging Device
9. Seventh Embodiment of Solid-state Imaging Device
10. Eighth Embodiment of Solid-state Imaging Device
11. Ninth Embodiment of Solid-state Imaging Device
12. Tenth Embodiment of Solid-state Imaging Device
13. Eleventh Embodiment of Solid-state Imaging Device
14. Electronic Apparatus

[1. Summary of Solid-State Imaging Device]

First, prior to description of embodiments of a solid-state imaging device of the present technology, summary of the solid-state imaging device is described. In a back-illumination-type solid-state imaging device that includes a film having a negative fixed charge, the film having the negative fixed charge is formed on the entire surface of a semiconductor base in order to suppress generation of dark current resulting from an interface state of the semiconductor base. In this structure, the film having the negative fixed charge is provided not only on a photoelectric conversion element (a photodiode PD) formed on the semiconductor base, but also on a separation region (an inter-pixel region) between adjacent photodiodes PD, on a peripheral circuit section in which peripheral circuits are formed, and the like. The solid-state imaging device having such a structure has some problems.

When a material that has a refractive index smaller than that of the semiconductor base is used as the film having the negative fixed charge, reflection of incident light is suppressed, and the film having the negative fixed charge therefore serves as an anti-reflection film. When a low reflection film is formed on the photoelectric conversion element, this is preferable because sensitivity is increased due to anti-reflection characteristics.

However, when the film having the negative fixed charge that has a refractive index smaller than that of the semiconductor base is formed not only on the photoelectric conversion element but also in an entire pixel region that includes the inter-pixel region, there is an issue of increase in color mixture. Specifically, due to the anti-reflection characteristics of the film having the negative fixed charge, sensitivity of the whole of the semiconductor base is increased, and an amount of a signal charge generated in the semiconductor base in the inter-pixel region is also increased. Further, due to increase in signal charge in the inter-pixel region, an amount of a straying signal charge is increased, and a flow-in amount to the photoelectric conversion element is increased. As a result, color mixture is increased. As described above, increase in color mixture between pixels is an issue in the solid-state imaging device including the film having negative fixed charge.

To address the above-described issue of color mixture, for example, it is effective to form a metal light blocking layer in a lattice shape on the inter-pixel region. However, because the film having the negative fixed charge, the insulating film, and the like are laminated between the semiconductor base and the metal light blocking layer, a distance from the metal light blocking layer to the semiconductor base is long. For this reason, light blocking by the metal light blocking layer is not allowed to be performed sufficiently with respect to light that enters from an oblique direction. As described above, the configuration that includes the film having the negative fixed charge is effective in suppression of dark current and improvement in sensitivity due to provision of the anti-reflection characteristics in the photoelectric conversion element, but has the issue of color mixture resulting from increase in sensitivity in the inter-pixel region.

Also, there is proposed a solid-state imaging device (a laminated-type imaging device) that has a configuration in which a photoelectric conversion material is provided outside the semiconductor base. In the solid-state imaging device having this configuration, a contact section to which a charge that has been subjected to photoelectric conversion in the photoelectric conversion material is transferred is formed on a surface on the second surface side of the semiconductor base. The charge that has been subjected to photoelectric conversion in the photoelectric conversion material is read to a circuit formation surface of the semiconductor base via this contact section. The contact section may be desirably configured of a high-concentration impurity region for suppressing dark current. Also in the solid-state imaging device having this configuration, the technique of laminating the film having the negative fixed charge on the semiconductor surface is effective for suppressing dark current on the surface of the semiconductor base.

In the laminated-type imaging device, a well having a conductivity type opposite of that of the contact section is formed around the contact section. Further, a depletion layer is formed between the contact section and the well. This depletion layer extends from an interface of the contact section and the well in the semiconductor base to the surface of the semiconductor base that has many carrier generation sources such as the interface state.

For this reason, when the film having the negative fixed charge is formed on the contact section of the imaging device described above, the depletion layer formed around the contact section expands to the contact section side. Alternatively, electric field intensity of this depletion layer is increased. Moreover, by providing the film having the negative fixed charge on the surface of the semiconductor base, the depletion layer is formed between the contact section and the hole accumulation layer that is formed in the semiconductor base interface. Accordingly, dark current in the contact section is increased. As described above, the second problem is increase in dark current.

In an embodiment of the present technology, there is proposed a configuration that is capable of achieving both suppression of dark current and improvement in sensitivity in the photoelectric conversion element, and suppression of color mixture in the inter-pixel region, in the solid-state imaging device that includes the film having the negative fixed charge. Further, there is proposed a configuration that is capable of achieving both suppression of dark current in the semiconductor base interface due to the film having the negative fixed charge and suppression of dark current in the contact section, in the solid-state imaging device that has a configuration in which the photoelectric conversion material is provided outside the semiconductor base. With the configuration that is capable of achieving both suppression of dark current in the semiconductor base interface and suppression of dark current in the contact section, and suppression of color mixture in the inter-pixel region, or the suppression of dark current in the contact section, the solid-state imaging device superior in imaging characteristics is configured.

[2. First Embodiment of Solid-State Imaging Device]
[Schematic Configuration of Solid-State Imaging Device]

Description is provided of an embodiment of a solid-state imaging device to which the present technology is applied.

FIG. 1 illustrates a schematic configuration of a CMOS-type solid-state imaging device 1 as an example of the solid-state imaging device to which the present technology is applied. The configuration in FIG. 1 is a configuration common to solid-state imaging devices according to the respective embodiments described below. Further, in the embodiments below, description is provided of a so-called back-illumination-type CMOS-type solid-state imaging device in which the opposite (back surface) side of the circuit formation surface (front surface) side of the semiconductor base is configured to serve as a light entering surface.

[General Configuration of Solid-State Imaging Device]

FIG. 1 is a schematic configuration diagram illustrating the whole of the CMOS-type solid-state imaging device 1 according to a first embodiment. The solid-state imaging device 1 of the present embodiment example is configured to include a pixel region 3, a vertical drive circuit 4, a column signal processing circuit 5, a horizontal drive circuit 6, an output circuit 7, a control circuit 8, etc. The pixel region 3 is configured of a plurality of pixels 2 that are arranged on a semiconductor base 11.

The pixel 2 is configured of a photodiode that is the photoelectric conversion element, and a plurality of pixel transistors. The plurality of pixels 2 are arranged, on the semiconductor base 11, regularly in a two-dimensional array. The pixel transistors configuring the pixel 2 may be four pixel transistors that are configured of a transfer transistor, a reset transistor, a selection transistor, and an amplifier transistor, or may be three transistors excluding the selection transistor therefrom.

The pixel region 3 is configured of the plurality of pixels 2 that are arranged regularly in a two-dimensional array. The pixel region 3 is configured of an effective pixel region and a black reference pixel region (not illustrated). The effective pixel region amplifies a signal charge that has been generated by actual light reception and photoelectric conversion thereon and reads the amplified charge to the column signal processing circuit 5. The black reference pixel region is for outputting optical black that serves as a reference of black level. The black reference pixel region is typically formed in an outer peripheral portion of the effective pixel region.

The control circuit 8 generates a clock signal, a control signal, etc. that serve as references of operations of the vertical drive circuit 4, the column signal processing circuit 5, the horizontal drive circuit 6, etc., based on a vertical synchronization signal, a horizontal synchronization signal, and a master clock. Further, the clock signal, the control signal, etc. generated by the control circuit 8 are inputted to the vertical drive circuit 4, the column signal processing circuit 5, the horizontal drive circuit 6, etc.

The vertical drive circuit 4 may be configured, for example, of a shift register, and selectively and sequentially scans the respective pixels 2 in the pixel region 3 on a row unit basis in a vertical direction. Further, the vertical drive circuit 4 supplies, to the column signal processing circuit 5 via a vertical signal line 9, a pixel signal based on the signal charge that has been generated in accordance with a light reception amount in the photodiode in each of the pixels 2.

The column signal processing circuit 5 may be arranged, for example, for each column of the pixels 2. The column signal processing circuit 5 may perform, for each pixel column, a signal process such as noise removal and signal amplification on the signals outputted from the pixels 2 corresponding to one row, in response to a signal from the black reference pixel region (which is not illustrated but is formed around the effective pixel region). A horizontal selection switch (not illustrated) is arranged between an output stage of the column signal processing circuit 5 and a horizontal signal line 10.

The horizontal drive circuit 6 may be configured, for example, of a shift resistor. The horizontal drive circuit 6 sequentially outputs horizontal scanning pulses to select the respective column signal processing circuits 5 in order, and allows pixel signals to be outputted from the respective column signal processing circuits 5 to the horizontal signal line 10. The output circuit 7 performs a signal process on the signals that are sequentially supplied from the respective column signal processing circuits 5 via the horizontal signal line 10 and outputs the processed signals.

[Configuration of Main Part of Solid-State Imaging Device (Planar View)]

FIG. 2 illustrates a schematic planar configuration in the unit pixel 2 in the solid-state imaging device. The unit pixel 2 is configured of a photoelectric conversion region and a charge reading section. In the photoelectric conversion region, first to third photoelectric conversion elements that each perform photoelectric conversion on light having a wavelength of red (R), green (G), or blue (B) are laminated in three layers. The charge reading section corresponds to each of the photoelectric conversion elements. In the present embodiment example, the photoelectric conversion region is configured of the first photoelectric conversion element and the second photoelectric conversion element that are formed in the semiconductor base, and the third photoelectric conversion element (a photoelectric conversion film) that is formed on the light receiving surface of the semiconductor base. Moreover, the photoelectric conversion region is provided with an impurity diffusion region 13 connected to the first photoelectric conversion element, an impurity diffusion region 12 connected to the second photoelectric conversion element, and an impurity diffusion region 14 connected to the third photoelectric conversion element (the photoelectric conversion film). The charge reading section is configured of first to third pixel transistors TrA, TrB, and TrC that correspond to the first to third photoelectric conversion elements, respectively. In the solid-state imaging device 1, light is separated in a vertical direction in the unit pixel 2.

The first to third pixel transistors TrA, TrB, and TrC are formed in the periphery of the photoelectric conversion regions, and are each configured of four MOS-type transistors. The first pixel transistor TrA is configured of a first transfer transistor Tr1, a reset transistor Tr4, an amplifier transistor Tr5, and a selection transistor Tr6 that output, as a pixel signal, a signal charge that is generated and accumulated in the first photoelectric conversion element described later. The second pixel transistor TrB is configured of a second transfer transistor Tr2, a reset transistor Tr7, an amplifier transistor Tr8, and a selection transistor Tr9 that output, as a pixel signal, a signal charge that is generated and accumulated in the second photoelectric conversion element described later. The third pixel transistor TrC is configured of a third transfer transistor Tr3, a reset transistor Tr10, an amplifier transistor Tr11, and a selection transistor Tr12 that output, as a pixel signal, a signal charge that is generated and accumulated in the third photoelectric conversion element (the photoelectric conversion film) described later.

The first transfer transistor Tr1 is configured of a floating diffusion section FD1 and a transfer gate electrode 15. The floating diffusion section FD1 is adjacent to the impurity diffusion region 13 and is formed on the front surface (the first surface) side of the semiconductor base. The transfer gate electrode 15 is formed on the semiconductor base 11 with a gate insulating film in between. The second transfer transistor Tr2 is configured of a floating diffusion section FD2 and a transfer gate electrode 16. The floating diffusion section FD2 is adjacent to the impurity diffusion region 12 and is formed on the front surface (the first surface) side of the semiconductor base. The transfer gate electrode 16 is formed on the semiconductor base 11 with a gate insulating film in between. The third transfer transistor Tr3 is configured of a floating diffusion section FD3 and a transfer gate electrode 17. The floating diffusion section FD3 is adjacent to the impurity diffusion region 14 and is formed on the front surface (the first surface) side of the semiconductor base. The transfer gate electrode 17 is formed on the semiconductor base 11 with a gate insulating film in between.

Moreover, in the back-illumination-type solid-state imaging device, the front surface (the circuit formation surface) side of the semiconductor base 11 is provided with the reset transistors Tr4, Tr7, and Tr10, the amplifier transistors Tr5, Tr8, and Tr11, and the selection transistors Tr6, Tr9, and Tr12. The reset transistors Tr4, Tr7, and Tr10 are each configured of source-drain regions 23 and 24 and a gate electrode 20. The amplifier transistors Tr5, Tr8, and Tr11 are each configured of source-drain regions 24 and 25 and a gate electrode 21. The selection transistors Tr6, Tr9, and Tr12 are each configured of source-drain regions 25 and 26 and a gate electrode 22.

Moreover, in each of these pixel transistors TrA, TrB, and TrC, the floating diffusion sections FD1, FD2, and FD3 are each connected to one source-drain region 23 of the corresponding reset transistors Tr4, Tr7, or Tr10. Further, the floating diffusion sections FD1, FD2, and FD3 are connected to the gate electrodes 21 of the corresponding amplifier transistors Tr5, Tr8, and Tr11, respectively. Further, the source-drain regions 24 that are shared between the reset transistors Tr4, Tr7, and Tr10 and the amplifier transistors Tr5, Tr8, and Tr11 are connected to a power voltage line Vdd. Further, one source-drain region 26 of each of the selection transistors Tr6, Tr9, and Tr12 is connected to a selection signal line VSL.

[Configuration of Pixel Section of Solid-State Imaging Device]

FIG. 3 illustrates a schematic configuration of the photoelectric conversion region illustrated in FIG. 2. FIG. 3 is a cross-sectional configuration of a main part in the photoelectric conversion region in the solid-state imaging device. In FIG. 3, only the first to third transfer transistors Tr1, Tr2, and Tr3 in the first to third pixel transistors TrA, TrB, and TrC are illustrated, and illustration of other pixel transistors are omitted. The solid-state imaging device of the present embodiment is a back-illumination-type solid-state imaging device in which light enters from the back surface (the second surface) side opposite from the front surface (the first surface) side of the semiconductor base 11 on which the pixel transistors are formed. In FIG. 4, the upper side of the drawing is set as a light receiving surface side, and the lower side is set as the circuit formation surface on which the pixel transistors, peripheral circuits such as a logic circuit, etc. are formed.

The solid-state imaging device illustrated in FIG. 3 includes, as the unit pixel 2, a region in which the first photodiode PD1 and the second photodiode PD2 described above, as well as a photoelectric conversion film 32 and a vertical transfer path 40 are formed. Further, an inter-pixel region 30 is included in a region between the adjacent unit pixels 2.

The solid-state imaging device illustrated in FIG. 3 includes, in the semiconductor base 1, the first photodiode PD1 and the second photodiode PD2 that serve as the first and second photoelectric conversion elements. Further, the solid-state imaging device illustrated in FIG. 3 includes, on the second surface side of the semiconductor base 11, the photoelectric conversion film 32 that serves as the third photoelectric conversion element. The first photodiode PD1 and the second photodiode PD2 are laminated in a light incidence direction in the semiconductor base 11, and the photoelectric conversion film 32 is laminated on the first photodiode PD1 and the second photodiode PD2.

In such a manner, the solid-state imaging device of the present example has a configuration in which the photoelectric conversion film 32, the first photodiode PD1, and the second photodiode PD2 are laminated in the light incidence direction. Further, the photoelectric conversion film 32, the first photodiode PD1, and the second photodiode PD2 that are laminated configure one unit pixel 2.

The first photodiode PD1 and the second photodiode PD2 are formed in a well region (p-Well) 44 in the semiconductor base 11. The semiconductor base 11 may be configured of silicon or the like and is of a second conductivity type (an n-type, in the present example). The well region 44 is configured of a semiconductor region of a first conductivity type (a p-type, in the present example). The first photodiode PD1 includes an n-type semiconductor region 45 that is formed on the back surface (the second surface) side serving as the light receiving surface of the semiconductor base 11 and is configured of an impurity of the second conductivity type (the n-type, in the present example). The second photodiode PD2 is configured of an n-type semiconductor region 46 that is formed on the front surface (the first surface) side of the semiconductor base 11. Further, a p-type semiconductor region (illustration thereof is omitted) having high concentration that serves as the hole accumulation layer is formed in the interface of the semiconductor base 11 on the front surface (the first surface) side of the n-type semiconductor region 46.

Moreover, the transfer gate electrode 15 and the floating diffusion section FD1 are formed adjacent to the first photodiode PD1 to configure the first transfer transistor Tr1. The transfer gate electrode 15 is formed, with the gate insulating film in between, in a trench that is formed from the first surface side of the semiconductor base 11 to the vicinity of the n-type semiconductor region 45. The floating diffusion section FD1 is formed on the first surface side of the semiconductor base 11. A charge is transferred by the transfer gate electrode 15 to the floating diffusion section FD1 on the front surface of the semiconductor base 11.

The floating diffusion section FD2 and the transfer gate electrode 16 are formed adjacent to the second photodiode PD2 to configure the second transfer transistor Tr2. The transfer gate electrode 16 is formed on the front surface of the semiconductor base 11 with a gate insulating film in between. Further, the floating diffusion section FD2 is formed on the front surface of the semiconductor base 11 with the transfer gate electrode 16 between the floating diffusion section FD2 and the second photodiode PD2.

The photoelectric conversion film 32 is formed on a second film member 36 on the back surface (the second surface) side of the semiconductor base 11. Further, a top electrode 33 and a bottom electrode 31 are formed on both of the upper and lower surfaces of the photoelectric conversion film 32. The top electrode 33 and the bottom electrode 31 are configured of an optically-transmissive material. Also, a planarization layer 38 is formed on the top electrode 33. Further, an on-chip lens 39 is formed on the planarization layer 38.

The first photodiode PD1 and the second photodiode PD2 perform photoelectric conversion on light having different wavelengths depending on a difference in absorption coefficient. Charges generated in the first photodiode PD1 and the second photodiode PD2 are accumulated in those regions, and are then outputted to the outside by the reading circuit. The second photodiode PD2 that is formed in a region farthest from the light receiving surface serves as a photoelectric conversion element that performs photoelectric conversion on light having a red wavelength. The first photodiode PD1 formed on the light receiving surface side serves as a photoelectric conversion element that performs photoelectric conversion on light having a blue wavelength. Further, the photoelectric conversion film 32 arranged on the back surface of the semiconductor base 11 serves as a photoelectric conversion element that performs photoelectric conversion on light having a green wavelength.

When used as the photoelectric conversion element that performs photoelectric conversion on light having the green wavelength, the photoelectric conversion film 32 may be configured, for example, of an organic photoelectric conversion material that includes a rhodamine-based pigment, a merocyanine-based pigment, quinacridone, or the like. Further, the top electrode 33 and the bottom electrode 31 are configured of an optically-transmissive material, and may be configured, for example, of a transparent conductive film such as an indium-tin (ITO) film or an indium-zinc oxide film.

It is to be noted that the photoelectric conversion film 32 may be configured of a material that performs photoelectric conversion on light having a wavelength of blue or red, and the first photodiode PD1 and the second photodiode PD2 may be configured to correspond to other wavelengths. For example, when blue light is absorbed in the photoelectric conversion film 32, the first photodiode PD1 formed on the light receiving surface side of the semiconductor base 11 may be set as a photoelectric conversion element that performs photoelectric conversion on green light. Further, the second photodiode PD2 may be set as a photoelectric conversion element that performs photoelectric conversion on red light. Alternatively, when red light is absorbed in the photoelectric conversion film 32, the first photodiode PD1 formed on the light receiving surface side of the semiconductor base 11 may be set as a photoelectric conversion element that performs photoelectric conversion on blue light. Further, the second photodiode PD2 may be set as a photoelectric conversion element that performs photoelectric conversion on green light. A photoelectric conversion film that performs photoelectric conversion on blue light may be configured, for example, of an organic photoelectric conversion material that includes a coumaric acid pigment, tris-8-hydroxyquinoli Al (Alq3), a merocyanine-based pigment, or the like. Further, a photoelectric conversion film that performs photoelectric conversion on red light may be configured of an organic photoelectric conversion material that includes a phthalocyanine-based pigment.

In the solid-state imaging device of the present example, light that is subjected to photoelectric conversion in the semiconductor base 11 is set to have the wavelength of blue and the wavelength of red. Further, light that is subjected to photoelectric conversion in the photoelectric conversion film 32 is set to have the wavelength of green. In such a configuration, by receiving the wavelength of green which is an intermediate wavelength in the photoelectric conversion film 32, it is possible to improve spectrum characteristics between the first photodiode PD1 and the second photodiode PD2.

A contact plug 34 that runs through the second film member 36 is connected to the bottom electrode 31 formed on the semiconductor base 11 side of the photoelectric conversion film 32. The contact plug 34 is connected to the vertical transfer path 40 that is formed from the first surface side to the second surface side of the semiconductor base 11.

The vertical transfer path 40 is configured of a contact section 41, a potential barrier section 42, and a charge accumulation section 43 that are formed in the vertical direction from the second surface side to the first surface side of the semiconductor base 11. The contact section 41 is configured of a high-concentration n-type impurity region that is formed on the second surface side of the semiconductor base 11. The contact section 41 is configured to establish ohmic contact with the contact plug 34. The potential barrier section 42 is configured of a low-concentration p-type impurity region, and serves as a potential barrier between the contact section 41 and the charge accumulation section 43. The charge accumulation section 43 is a region that accumulates signal charges transferred from the photoelectric conversion film 32, and is configured of an n-type impurity region that has lower concentration than the contact section 41. Further, a high-concentration p-type impurity region (illustration thereof is omitted) is formed on an uppermost surface of the semiconductor base 11, and generation of dark current in the interface of the semiconductor base 11 is suppressed thereby.

The floating diffusion section FD3 and the transfer gate electrode 17 are formed adjacent to the vertical transfer path 40 to configure the third transfer transistor Tr3. The transfer gate electrode 17 is formed on the front surface of the semiconductor base 11 with a gate insulating film in between. Further, the floating diffusion section FD3 is formed on the front surface of the semiconductor base 11 with the transfer gate electrode 17 between the vertical transfer path 40 and the floating diffusion section FD3.

An interlayer insulating layer 37 is formed on the first surface of the semiconductor base 11. The interlayer insulating layer 37 is formed to cover the transfer gate electrodes 15, 16, and 17, other gate electrodes, etc. that are formed on the semiconductor base 11. Moreover, conductive layers such as a plug and a wiring that are connected to the gate electrode, the floating diffusion section, etc. are formed inside the interlayer insulating layer 37.

[First Film Member and Second Film Member]

A first film member 51 and the second film member 36 are formed between the second surface side of the semiconductor base 11 and the photoelectric conversion film 32. The first film member 51 is formed only on a region in which the first photodiode PD1 and the second photodiode PD2 are formed. Further, the second film member 36 is formed to cover a region other than a region covered with the first film member and to cover a region on the first film member 51. Further, the bottom electrode 31 and the contact plug 34 are formed inside the second film member 36. Further, in the second film member 36, a light blocking layer 35 is formed in the inter-pixel region 30.

The first film member 51 may be preferably configured of a film having a negative fixed charge. Examples of the film having the negative fixed charge may include hafnium oxide, aluminum oxide, zirconium oxide, tantalum oxide, and titanium oxide. Moreover, as a material other than the above-mentioned materials, it is also possible to form the film having the negative fixed charge of lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, an aluminum oxynitride film, or the like. Moreover, two or more films having negative fixed charges may be laminated. Moreover, the film having the negative fixed charge may be added with silicon (Si) or nitrogen (N) in the film in a range that does not degrade insulation. Its concentration may be appropriately determined in a range that does not degrade insulation of the film. By thus adding silicon (Si) or nitrogen (N), it is possible to increase heat resistance of the film, prevention ability against ion injection during the manufacturing steps, etc.

By providing the film having the negative fixed charge on the first photodiode PD1 and the second photodiode PD2, the hole accumulation (hole accumulation) layer is formed in the interface of the first photodiode PD1. Due to this hole accumulation layer, generation of an electron from the interface is suppressed, and further, the generated electron demises in the hole accumulation layer. As a result, it is possible to suppress dark current in the solid-state imaging device.

Moreover, when a material that has a refractive index smaller than that of the semiconductor base 11 is used as the film having the negative fixed charge, the film having the negative fixed charge serves as an anti-reflection film. Accordingly, when the film having the negative fixed charge to be a low reflection film is formed on the first photodiode PD1 and the second photodiode PD2, sensitivity of the solid-state imaging device is improved.

The second film member 36 may be formed of a material different from that of the first film member 51 described above. The second film member 36 may be made of a material that is used as an interlayer insulating film in a typical semiconductor unit. For example, the second film member 36 may be configured, for example, of an oxide film, a nitride film, an oxynitride film, or the like, of silicon.

The second film member 36 is formed on the semiconductor base 11 in the inter-pixel region 30. For this reason, when the material that has a refractive index smaller than that of the semiconductor base 11 is used, an amount of light incident on the inter-pixel region 30 of the semiconductor base 11 is increased, and an amount of signal charge generated in the inter-pixel region 30 is increased. This may be a cause for color mixture between pixels. Accordingly, as the second film member 36, a material that has a refractive index higher than that of the first film member 51 may be preferably used. Moreover, the second film member 36 may be preferably made of a material that has a refractive index higher than that of the semiconductor base 11.

Moreover, the second film member 36 is also formed on the contact section 41. A depletion layer is formed in an interface of the contact section 41 and the p-well 44 around the contact section 41. The depletion layer is also formed on the surface of the second surface of the semiconductor base 11. Accordingly, when the first film member configured of the film having the negative fixed charge is formed on the depletion layer in the interface of the contact section 41 and the p-well 44, the p-type of the p-well 44 is enhanced by an electric field induced by the film having the negative fixed charge. In other words, the depletion layer is enhanced compared to a case where the film having the negative fixed charge is not formed. Moreover, the depletion layer expands from the p-well 44 in a direction on the contact section 41 side. As a result, an amount of dark current that flows from the depletion layer to the contact section 41 is increased.

Accordingly, as the second film member 36 formed on the contact section 41, a material that has a negative fixed charge amount smaller than that of the first film member is used. By using the material that has a small negative fixed charge amount, enhancement and expansion of the depletion layer in the interface of the contact section 41 is allowed to be suppressed by the second film member 36. In particular, a material that is less likely to generate an interface state between the semiconductor base 11 made of silicon, for example, an oxide film formed as a result of reaction with silicon or the like may be preferably used. Due to this configuration, it is possible to suppress dark current in the contact section 41. It is to be noted that the second film member 36 may be preferably formed, in addition to the region on the contact section 41, also on a region in which the depletion layer expands in the interface of the contact section 41 and the p-well 44. By not forming the first film member 51 configured of the film having the negative fixed charge on the depletion layer, it is possible to further suppress dark current.

As illustrated in FIG. 3, when the same second film member 36 is formed in the inter-pixel region 30 and on the contact section 41, the second film member 36 may be preferably configured of a material that is capable of suppressing color mixture in the inter-pixel region 30 and of suppressing dark current in the contact section 41 as described above. In other words, as the second film member 36, a material that has a higher refractive index and a smaller negative fixed charge amount than the first film member 51 may be preferably used.

As described above, in the solid-state imaging device of the present example, the first film member configured of the film having the negative fixed charge is selectively formed only on the photodiode PD. Further, the second film member made of a material different from that of the first film member is formed in a region excluding the region on the photodiode PD. Due to this configuration, it is possible to suppress dark current by the film having the negative fixed charge in the photodiode PD. Moreover, it is possible to prevent an unfavorable function caused by the film having the negative fixed charge in a region other than the photodiode PD.

In particular, when a material that has a refractive index higher than those of the first film member and the semiconductor base is used as the second film member that has the above-described configuration, it is possible to suppress color mixture caused by the photoelectric conversion in the inter-pixel region. Moreover, when a material that has a negative fixed charge weaker than that of the first film member is used as the second film member that has the above-described configuration, it is possible to suppress dark current in the contact section.

It is to be noted that the first film member configured of the film having the negative fixed charge may be present or absent in the peripheral circuit region provided adjacent to the pixel region in the solid-state imaging device that has the above-described configuration. However, taking into consideration, the function of the film having the negative fixed charge, on the peripheral circuits, a configuration in which the first film member is not provided as in the inter-pixel region may be preferable.

Moreover, in the above-described embodiment, the photoelectric conversion film 32 provided as the third photoelectric conversion element may be configured of a charge retention section that is capable of retaining an electron as with a condenser. In the above-described present embodiment and respective embodiments described later, description is provided of an example of the present technology referring to the configuration in which the photoelectric conversion film 32 is provided in the third photoelectric conversion element. However, by substituting the charge retention section for this photoelectric conversion element, a configuration provided with the charge retention section may be adopted.

[3. Method of Manufacturing Semiconductor Unit of First Embodiment]

Next, description is provided of a method of manufacturing the solid-state imaging device of the first embodiment described above. FIGS. 4 to 9 are manufacturing step diagrams of the solid-state imaging device of the first embodiment, and in particular, diagrams that illustrate manufacturing steps in a region in which the photoelectric conversion elements are formed.

First, as illustrated in FIG. 4, the p-well 44 is formed at a predetermined position of the semiconductor base 11. Further, the contact section 41 and the charge accumulation section 43 that configure the vertical transfer path 40 are formed at predetermined positions in the p-well 44. Further, the n-type semiconductor region configuring the first photodiode PD1 and the n-type semiconductor region configuring the second photodiode PD2 are formed in the same step of forming the vertical transfer path 40. As the semiconductor base, for example, an SOI (Silicon on Insulator) substrate or the like may be used. Also, the transfer gate electrodes 15, 16, and 17 are formed on the first surface side of the semiconductor base 11 with an unillustrated gate oxide film in between. Further, the floating diffusion sections FD1, FD2, and FD3 are formed. After ion injection, an annealing process is performed. A region for ion injection is designed taking into consideration diffusion caused by the annealing process. The ion injection may be performed to be divided in a plurality of times. Further, the interlayer insulating layer 37 is formed on the front surface of the semiconductor base 11. Thereafter, an unillustrated support substrate, another semiconductor base, or the like may be joined on the first surface side of the semiconductor base 11, and the resultant is vertically inverted. Further, the semiconductor base 11 is separated from the oxide layer to expose the second surface side. Each of the configurations in the semiconductor base 11 illustrated in FIG. 4 may be formed by a technology used in a typical CMOS process such as ion injection or CVD that has been publicly known.

Next, as illustrated in FIG. 5, the first film member 51 is formed on the second surface side of the semiconductor base 11. The first film member 51 is formed on the entire surface on the second surface side of the semiconductor base 11. As the first film member 51, the above-described film having the negative fixed charge is used. The first film member 51 may be a single layer, or may be a lamination of a plurality of layers. Further, as illustrated in FIG. 6, a photoresist 52 is formed on the first film member 51 as illustrated in FIG. 6. Further, the photoresist in a region other than the region in which the photodiode PD is formed is removed by a photolithography step of exposure and development. Further, the first film member 51 exposed from the photoresist 52 is removed by dry etching or wet etching. The first film member 51 is thus patterned as illustrated in FIG. 7.

Next, as illustrated in FIG. 8, the second film member 36 is formed to cover the first film member 51 and the second surface side of the semiconductor base 11. As the second film member 36, for example, an insulating layer may be formed by an HDP-CVD method or the like. Further, the light blocking layer 35 is formed on the second film member 36. The light blocking layer 35 is formed in the inter-pixel region. Further, the contact plug 34 connected to the contact section 41 is formed in the second film member 36. For the contact plug 34, a contact hole is formed by opening a predetermined position in the second film member 36. Further, a barrier metal film is formed on a sidewall and a bottom surface of the contact hole and a metal material is brought to fill in to form the contact plug 34. The contact plug 34 may be configured, for example, of a laminated film of titanium (Ti) and titanium nitride (TiN) as the barrier metal film, and tungsten (W) as a filling metal material in order to achieve ohmic contact with the contact section 41.

Moreover, as illustrated in FIG. 9, after laminating the second film member 36, the bottom electrode 31 connected to the contact plug 34 is formed. As a transparent electrode that is the bottom electrode 31, for example, an ITO film having a thickness of about 100 nm formed by a sputtering method may be used. Further, the second film member 36 is laminated to cover the bottom electrode 31, and an opening portion from which the bottom electrode 31 is exposed is formed in this second film member 36. Further, the photoelectric conversion film 32 is formed to cover the opening portion. Thereafter, the top electrode 33 is formed on an entire surface of an upper portion of the photoelectric conversion film 32. As with the bottom electrode 31, for example, an ITO film having a thickness of about 100 nm formed by a sputtering method may be used also as the top electrode 33. Thereafter, the planarization layer 38 and the on-chip lens 39 are formed on an upper portion of the top electrode 33. The solid-state imaging device of the first embodiment is allowed to be manufactured by the above-described steps.

It is to be noted that, in the step of patterning the first film member 51, a hard mask method may be performed that uses an oxide film, silicon nitride, or the like is used, instead of the photoresist, on the first film member 51. For example, an oxide film, silicon nitride, or the like may be deposited on the first film member 51, and a pattern of the hard mask is formed by photolithography and etching. Further, the first film member 51 may be patterned by etching the first film member 51 with the use of this hard mask. Moreover, the solid-state imaging devices of the respective embodiments described below are also allowed to be manufactured by combining the manufacturing method described in the above embodiment and a publicly-known method of manufacturing a semiconductor unit.

[4. Second Embodiment of Solid-State Imaging Device]

Next, a second embodiment of the solid-state imaging device is described. FIG. 10 illustrates a cross-sectional configuration of a main part in a photoelectric conversion region of the solid-state imaging device of the second embodiment. It is to be noted that a configuration, in the second embodiment, similar to that in the first embodiment described above is designated with the same numeral, and description thereof is omitted.

The solid-state imaging device illustrated in FIG. 10 includes the first photodiode PD1 that is formed inside the semiconductor base 11 and serves as a photoelectric conversion element, and the first transfer transistor Tr1 that includes the first photodiode PD1. The first photodiode PD1 is configured of an n-type semiconductor region 45 made of a second-conductivity-type (an n-type, in the present example) impurity formed in the semiconductor base 11. The n-type semiconductor region 45 is formed in the well region (p-well) 44 in the second-conductivity-type (the n-type, in the present example) semiconductor base 11 made of silicon or the like. The well-region 44 is configured of a first-conductivity-type (a p-type, in the present example) semiconductor region.

A transfer gate electrode 53 is formed on the semiconductor base 11 and adjacent to the first photodiode PD1. Further, the floating diffusion section FD1 adjacent to the transfer gate electrode 53 is formed on the front surface of the semiconductor base 11 at a position facing the first photodiode PD1. In such a manner, the transfer gate electrode 53 and the floating diffusion section FD1 are formed adjacent to the first photodiode PD1 on the first surface side of the semiconductor base 11 to configure the first transfer transistor Tr1. Moreover, the interlayer insulating layer 37 is formed on the front surface of the semiconductor base 11 to cover the transfer gate electrode 53, etc.

Moreover, the first film member 51 and the second film member 36 are formed on the back surface of the semiconductor base 11. The first film member 51 is formed in a portion in which the first photodiode PD1 is formed. Further, the second film member 36 is formed to cover a region on the first film member 51 and a region on the second surface of the semiconductor base 11 in which the first film member 51 is not formed.

Moreover, the light blocking layer 35 is formed in the inter-pixel region 30 in the second film member 36. Further, a color filter 56 corresponding to the first photodiode PD1 is formed on the second film member 36 and the light blocking layer 35 with the planarization layer 55 in between. Moreover, the on-chip lens 39 corresponding to the first photodiode PD1 is formed on the color filter 56 with the planarization layer 38 in between.

The first film member 51 is configured of a film having a negative fixed charge as in the first embodiment described above. As the film having the negative fixed charge, the above-described materials may be used. Further, the planarization layers 38 and 55 and the on-chip lens 39 have configurations similar to those in the first embodiment described above. A color filter similar to that in a solid-state imaging device that has been publicly known is applicable as the color filter 56.

The second film member 36 is formed on the inter-pixel region 30 as illustrated in FIG. 10. Further, the second film member 36 may preferably cover the back surface of the semiconductor base 11 also in the peripheral circuit region formed around the pixel region. Because being formed on the inter-pixel region 30, the second film member 36 may be preferably made of a material that has a refractive index higher than that of the first film member 51. Further, the second film member 36 may be preferably made of a material that has a refractive index higher than that of the semiconductor base 11. Further, when the second film member 36 is formed on the back surface of the semiconductor base 11 also in the peripheral circuit region, the second film member 36 may be preferably made of a material that has a negative fixed charge amount smaller than that of the first film member 51.

In the present embodiment, as illustrated in FIG. 10, a configuration in which the first film member 51 is formed on the photodiode PD and other region is covered with the second film member 36 is allowed to be adopted also in a configuration in which the photodiode PD is singularly formed in the unit pixel 2. Also in this configuration, it is possible to suppress dark current on the photodiode PD, due to the first film member 51 configured of the film having the negative fixed charge. Further, it is possible to suppress color mixture by selectively forming the first film member 51 only on the photodiode PD, and forming the second film member 36, in the inter-pixel region 30, that has a refractive index higher than that of the first film member 51.

[Modification]

Next, a modification of the second embodiment is described. FIG. 11 illustrates a configuration of the modification of the solid-state imaging device of the second embodiment. In the modification, the configuration of the photodiode PD formed in the semiconductor base 11 is different from that in the above-described second embodiment.

A solid-state imaging device illustrated in FIG. 11 includes the first photodiode PD1 and the second photodiode PD2 that serve as the first and second photoelectric conversion elements in the semiconductor base 11. The first photodiode PD1 and the second photodiode PD2 are laminated in the light incidence direction in the semiconductor base 11.

The transfer gate electrode 15 and the floating diffusion section FD1 are formed adjacent to the first photodiode PD1 to configure the first transfer transistor Tr1. The transfer gate electrode 15 is formed in a trench formed from the first surface side of the semiconductor base 11 to a region of the first photodiode PD1 with a gate insulating film in between. The floating diffusion section FD1 is formed on the first surface side of the semiconductor base 11.

Moreover, the floating diffusion section FD2 and the transfer gate electrode 16 are formed adjacent to the second photodiode PD2 to configure the second transfer transistor Tr2. The transfer gate electrode 16 is formed on the front surface of the semiconductor base 11 with a gate insulating film in between. Further, the floating diffusion section FD2 is formed on the front surface of the semiconductor base 11 with the transfer gate electrode 16 between the second photodiode PD2 and the floating diffusion section FD2.

The interlayer insulating layer 37 is formed on the front surface of the semiconductor base 11 to cover the transfer gate electrode 17, etc. Further, the first film member 51 and the second film member 36 are formed on the back surface of the semiconductor base 11. The first film member 51 is formed only on a region in which the first photodiode PD1 is formed. Further, the second film member 36 is formed to cover a region on the first film member 51 and a region on the second surface of the semiconductor base 11 in which the first film member 51 is not formed.

Moreover, the light blocking layer 35 is formed in the inter-pixel region 30 in the second film member 36. Further, the color filter 56 corresponding to the first photodiode PD1 is formed on the second film member 36 and the light blocking layer 35 with the planarization layer 55 in between. Moreover, the on-chip lens 39 corresponding to the first photodiode PD1 and the second photodiode PD2 is formed on the color filter 56 with the planarization layer 38 in between.

As illustrated in FIG. 11, as in the second embodiment, the present technology is applicable also to the solid-state imaging device that has a configuration in which the photodiodes PD are laminated. Moreover, the present technology is applicable also to a solid-state Imaging device that has a configuration in which the photodiodes PD are formed in three layers in the semiconductor base, as in the second embodiment. An effect similar to that in the second embodiment is allowed to be achieved also in these configurations by selectively forming the first film member on the photodiode PD with the use of the first film member and the second film member.

[5. Third Embodiment of Solid-State Imaging Device]

Next, a third embodiment of the solid-state imaging device is described. It is to be noted that the third embodiment described below has a configuration similar to that in the first embodiment described above except for a configuration of film members on the back surface of the semiconductor base 11. Accordingly, in the description below of the third embodiment, a configuration similar to that in the first embodiment is designated with the same numeral and description thereof is omitted.

[Film Member]

A configuration of a solid-state imaging device of the third embodiment is illustrated in FIG. 12. In the solid-state imaging device illustrated in FIG. 12, the first film member 51, the second film member 36, and a third film member 57 are formed on the back surface of the semiconductor base 11. The first film member 51 is formed only on a region in which the first photodiode PD1 and the second photodiode PD2 are formed. Further, the third film member 57 is formed on the first film member 51. The third film member 57 is formed on an entire surface on the first film member 51, and is not formed in a region other than the first film member 51.

Moreover, the second film member 36 is formed to cover a region other than a region covered with the first film member 51 and the third film member 57, and a region on the third film member 57. Moreover, the bottom electrode 31, the contact plug 34, and the light blocking layer 35 are formed inside the second film member 36.

The first film member 51 and the third film member 57 may each be preferably configured of a film having a negative fixed charge. The film having the negative fixed charge may be made of the materials described above in the first embodiment. The first film member 51 and the third film member 57 may be configured of the same material, or may be configured of different materials. The first film member 51 and the third film member 57 may preferably have configurations that have different negative fixed charge amounts. Moreover, the second film member 36 may be preferably made of a material similar to that in the first embodiment described above.

As illustrated in FIG. 12, on a region in which the photodiode PD is formed, a configuration may be adopted in which the first film member 51 and the third film member 57 each configured of the film having the negative fixed charge are laminated. By forming a plurality of layers of films having negative fixed charges, an electric field to be applied to the semiconductor base 11 becomes the sum of electric fields of the plurality of formed films. Accordingly, it is possible to control intensity of the electric field to be applied to the semiconductor base 11 by adjusting a material, a thickness, a forming method, etc. of each of the first film member 51 and the third film member 57. By adopting such a configuration, it becomes easier to control the electric field to be applied to the semiconductor base 11, compared to a case where the film having the negative fixed charge is formed singularly. Moreover, freedom in selectivity of the configurations of the film members is improved, which also makes it possible to improve productivity of the semiconductor base.

[6. Fourth Embodiment of Solid-State Imaging Device]

Next, a fourth embodiment of the solid-state imaging device is described. It is to be noted that the fourth embodiment described below has a configuration similar to that in the first embodiment described above except for a configuration of film members on the back surface of the semiconductor base 11. Accordingly, in the description below of the fourth embodiment, a configuration similar to that in the first embodiment is designated with the same numeral and description thereof is omitted.

[Film Member]

A configuration of a solid-state imaging device of the fourth embodiment is illustrated in FIG. 13. In the solid-state imaging device illustrated in FIG. 13, a first film member 61, a second film member 62, and a third film member 63 are formed on the back surface of the semiconductor base 11. The first film member 61 is formed on a region in which the first photodiode PD1 and the second photodiode PD2 are formed, and on the inter-pixel region 30. Further, the second film member 62 is formed continuously on the first film member 61 and on the contact section 41. Moreover, the third film member 63 is formed to cover the second film member 62.

The first film member 61 may be preferably configured of a film having a negative fixed charge. The film having the negative fixed charge may be made of the material described above in the first embodiment. Further, a material that is typically used as an interlayer insulating film of wiring layers in a semiconductor unit may be applied to the third film member 63. Further, the bottom electrode 31, the contact plug 34, and the light blocking layer 35 are formed inside the third film member 63. The contact plug 34 runs through the second film member 62 on the contact section 41, and is connected to the contact section 41.

The second film member 62 is directly formed on the semiconductor base 11 in a region on the contact section 41. A region in which the second film member 62 is formed on the semiconductor base 11 is at least in a range equal to or larger than a range in which the depletion layer is formed in the interface of the contact section 41 and the p-well 44 around the contact section 41. Moreover, the second film member 62 may be preferably configured of a film having a negative fixed charge. The film having the negative fixed charge may be made of the material described above in the first embodiment. However, the second film member 62 may be preferably made of a material that has a negative fixed charge amount smaller than that of the first film member 61.

In a semiconductor unit having the configuration illustrated in FIG. 13, dark current may be generated also in the contact section 41 due to the interface state of the surface of the semiconductor base 11. Accordingly, it is possible to suppress dark current from the surface of the semiconductor base 11 by forming the film having the negative fixed charge. However, when the negative fixed charge amount is large, the depletion layer in the interface of the contact section 41 and the p-well 44 is influenced thereby, and dark current is increased. For this reason, a material that is capable of suppressing dark current as a whole may be preferably applied as the second film member 62, taking into consideration a suppression amount of the dark current from the surface of the semiconductor base 11 and an increase amount of the dark current from the depletion layer in the interface of the contact section 41 and the p-well 44.

It is to be noted that, in the present example, the configuration in which the first film member 61 and the second film member 62 are formed in the inter-pixel region 30 is described. However, in the inter-pixel region 30, the configurations of the film members are, allowed to be appropriately selected taking into consideration refractive indices of the film members to be formed. For example, the first film member 61 and the second film member 62 may be formed on the inter-pixel region 30 as in the present example, when the issue of color mixture caused by a charge generated in the inter-pixel region 30 does not occur or occurs in a negligible extent. Moreover, when taking into consideration the generation of color mixture, a film having a preferable refractive index may be appropriately selected from the first to third film members 61, 62, and 63 to be formed in the inter-pixel region 30.

[7. Fifth Embodiment of Solid-State Imaging Device]

Next, a fifth embodiment of the solid-state imaging device is described. It is to be noted that the fifth embodiment described below has a configuration similar to that in the first embodiment described above except for a configuration of film members on the back surface of the semiconductor base 11. Accordingly, in the description below of the fifth embodiment, a configuration similar to that in the first embodiment is designated with the same numeral and description thereof is omitted.

[Film Member]

A configuration of a solid-state imaging device of the fifth embodiment is illustrated in FIG. 14. In the solid-state imaging device illustrated in FIG. 14, a first film member 64, a second film member 65, a third film member 66, and a fourth film member 67 are formed on the back surface of the semiconductor base 11. The first film member 64 is formed only on a region in which the first photodiode PD1 and the second photodiode PD2 are formed. The second film member 65 is formed to cover a region on the contact section 41, and a region on the depletion layer that extends in the interface with the p-well 44 around the contact section 41. The third film member 66 is formed on the semiconductor base 11 in the inter-pixel region 30. Further, the fourth film member 67 is formed to cover a region on the first to third film members 64, 65, and 66.

The first film member 64 may be preferably configured of a film having a negative fixed charge. The film having the negative fixed charge may be made of the material described above in the first embodiment. Further, a material that is typically used as an interlayer insulating film of wiring layers in a semiconductor unit may be applied as the fourth film member 67. Further, the bottom electrode 31, the contact plug 34, and the light blocking layer 35 are formed inside the fourth film member 67. The contact plug 34 runs through the second film member 65 on the contact section 41, and is connected to the contact section 41.

As in the fourth embodiment, the second film member 65 may be preferably configured of a film having a negative fixed charge. However, the second film member 65 may be preferably made of a material that has a negative fixed charge amount smaller than that of the first film member 64. By selecting such a film having the negative fixed charge for the second film member 65, it becomes possible to suppress dark current in the contact section 41. The third film member 66 may be preferably configured of a film having a negative fixed charge as with the first film member 64. By providing the negative fixed charge, dark current from the surface of the semiconductor base 11 is suppressed.

Moreover, the third film member 66 has a refractive index higher than that of the first film member 64, which suppresses generation of a charge in the inter-pixel region 30 and makes it possible to suppress color mixture. For example, when the semiconductor base 11 is made of Si and the fourth film member 67 configuring the wiring layer is made of $SiO_2$, by causing the first film member 64 to have a refractive index that is between those of Si and $SiO_2$, anti-reflection characteristics due to the first film member 64 is made effective. Further, by causing the third film member 66 to have a tropism rate that is similar to or higher than that of $SiO_2$, a reflection component in the third film member 66 is increased. Accordingly, generation of a charge in the inter-pixel region 30 is suppressed, which makes it possible to suppress color mixture.

As described above, the films having negative fixed charges that are made of different materials may be formed in the respective regions on the photodiode PD, the inter-pixel region, and the contact section. By forming the films having the negative fixed charges in all of the regions, it is possible to suppress dark current from the surface of the semiconductor base 11. Moreover, by selecting, for each of the regions, the material, the thickness, the forming method, etc., so that the negative fixed charge amount of the film member, the refractive index, etc. are made optimum, suppression of dark current, suppression of color mixture, etc. are achieved.

[8. Sixth Embodiment of Solid-State Imaging Device]

Next, a sixth embodiment of the solid-state imaging device is described. It is to be noted that the sixth embodiment described below has a configuration similar to that in the first embodiment described above except for a configuration of film members on the back surface of the semiconductor base 11. Accordingly, in the description below of the sixth embodiment, a configuration similar to that in the first embodiment is designated with the same numeral and description thereof is omitted.

[Film Member]

A configuration of a solid-state imaging device of the sixth embodiment is illustrated in FIG. 15. In the solid-state imaging device illustrated in FIG. 15, a first film member 68, a second film member 69, and a third film member 71 are formed on the back surface of the semiconductor base 11. The second film member 69 is formed on a region in which a depletion layer is formed in the interface of the contact section 41 and the p-well 44 around the contact section 41. Further, the first film member 68 is formed on a region in which the first photodiode PD1 and the second photodiode PD2 are formed, and on the second film member 69. Moreover, the third film member 71 is formed to cover a region, on the semiconductor base 11, in which the first film member 68 is not formed, and a region on the first film member 68.

The first film member 68 may be preferably configured of a film having a negative fixed charge. The film having the negative fixed charge may be made of the material described above in the first embodiment. Further, a material that is typically used as an interlayer insulating film of wiring layers in a semiconductor unit may be applied as the third film member 71. The bottom electrode 31, the contact plug 34, and the light blocking layer 35 are formed inside the third film member 71. The contact plug 34 runs through the first film member 68 and the second film member 69 on the contact section 41, and is connected to the contact section 41.

The second film member 69 is formed of a material that has a small interface state. The second film member 69 may be configured, for example, of an oxide film that is formed as a result of reaction with the material of the semiconductor base 11, or the like. Further, the second film member 69 is formed to have a thickness that does not give influence of the first film member 68, configured of the film having the negative fixed charge, on the contact section 41 and the depletion layer formed around the contact section 41.

By forming the second film member 69 on the contact section 41 and between a region around the contact section 41 and the first film member 68, a configuration is achieved in which the first film member 68 is not in direct contact with the periphery of the contact section 41. By adopting this configuration, no influence is given on the depletion layer in the interface of the contact section 41 and the p-well 44 around the contact section 41. Accordingly, it is possible to suppress generation of dark current from the depletion layer.

Moreover, in a portion covered with the first film member 68, dark current from the surface of the semiconductor base 11 is suppressed due to the film having the negative fixed charge. Accordingly, it is possible to suppress dark current from the surface of the semiconductor base 11 in a formation region of the photodiode PD. Further, by using the material that has a small interface state as the second film member 69, it is possible to suppress dark current in the periphery of the contact section 41 covered with the second film member 69. Moreover, in the inter-pixel region 30, by providing the third film member 71 that has a refractive index increasing the reflection component, it is possible to suppress generation of a charge in the inter-pixel region 30, and to suppress color mixture.

As described above, in addition to selectively forming the films having the negative fixed charge, different kinds of films may be provided between the semiconductor base 11 and the films having the negative fixed charge in the respective regions of a region on the photodiode PD, the inter-pixel region, and the contact section.

[9. Seventh Embodiment of Solid-State Imaging Device]

Next, a seventh embodiment of the solid-state imaging device is described. It is to be noted that the seventh embodiment described below has a configuration similar to that in the first embodiment described above except for a configuration of film members on the back surface of the semiconductor base 11. Accordingly, in the description below of the seventh embodiment, a configuration similar to that in the first embodiment is designated with the same numeral and description thereof is omitted.

[Film Member]

A configuration of a solid-state imaging device of the seventh embodiment is illustrated in FIG. 16. In the solid-state imaging device illustrated in FIG. 16, a first film member 72, a second film member 73, and a third film member 74 are formed on the back surface of the semiconductor base 11. The first film member 72 is formed only on a region in which the first photodiode PD1 and the second photodiode PD2 are formed. The second film member 73 is formed to cover a region on the contact section 41 and a region on the depletion layer that extends in the interface with the p-well 44 around the contact section 41. The third film member 74 is formed to cover a region, on the semiconductor base 11, in which the first film member 72 and the second film member 73 are not formed, and a region on the first film member 72 and the second film member 73.

The first film member 72 and the second film member 73 are each configured of a conductive layer. The first film member 72 is configured of a transparent electrode to which a voltage is allowed to be applied. The first film member 72 and the second film member 73 are configured to be separated from each other with the third film member 74 in between. Further, unillustrated wirings are connected to the respective first film member 72 and second film member 73, which achieves a configuration in which a voltage is allowed to be applied to each of the first film member 72 and the second film member 73 independently. The transparent electrode may be made of the material same as that of the top electrode 33 and the bottom electrode 33 described above. Moreover, a material that is typically used as a wiring or an electrode in a semiconductor unit may be applied as the second film member 73. In particular, when the second film member 73 is formed of a transparent electrode same as the first film member 72, the first film member 72 and the second film member 73 are allowed to be fabricated in the same step. For this reason, the second film member 73 may be preferably formed of a transparent electrode that is the same as the first film member 72.

A material that is typically used as an interlayer insulating film of wiring layers in a semiconductor unit may be applied as the third film member 74. The bottom electrode 31, the contact plug 34, and the light blocking layer 35 are formed inside the third film member 74. An insulating layer 75 is formed around the contact plug 34, and the second film member 73 and the contact plug 34 are configured not to be in contact with each other.

By configuring each of the first film member 72 and the second film member 73 of a conductive layer, generation of an electron from the interface of the semiconductor base 11 is suppressed when a negative bias is applied to the first film member 72 and the second film member 73, which makes it possible to suppress dark current. By applying the negative bias, the hole accumulation layer is formed on the surface of the semiconductor base 11 as in the case of forming the film having the negative fixed charge, which suppresses dark current.

Moreover, in the present example, separated conductive layers are formed in the respective regions of the region in which the photodiode PD is formed and the region in which the contact section 41 is formed. It is therefore possible to appropriately and independently adjust voltages to be applied to the respective film members. For example, by causing the voltage to be applied to the first film member 72 to be higher than the voltage to be applied to the second film member 73, the hole accumulation amount in the interface of the semiconductor base 11 on the photodiode PD is increased, which suppresses dark current. Moreover, by lowering the voltage to be applied to the second film member 73 at this time, dark current from the interface of the semiconductor base 11 around the contact section 41 is suppressed, and an influence on the depletion layer around the contact section 41 is suppressed to suppress generation of dark current resulting from the depletion layer.

As described above, the conductive layers may be selectively formed instead of the films having the negative fixed charges on the respective regions of the region on the photodiode PD and the contact section. By adopting such a configuration, suppression of dark current, suppression of color mixture, etc. are achieved.

[10. Eighth Embodiment of Solid-State Imaging Device]

Next, an eighth embodiment of the solid-state imaging device is described. It is to be noted that the eighth embodiment described below has a configuration similar to that in the first embodiment described above except for a configuration of film members on the back surface of the semiconductor base 11. Accordingly, in the description below of the eighth embodiment, a configuration similar to that in the first embodiment is designated with the same numeral and description thereof is omitted.

[Film Member]

A configuration of a solid-state imaging device of an eighth embodiment is illustrated in FIG. 17. In the solid-state imaging device illustrated in FIG. 17, a first film member 76 and the second film member 36 are formed on the back surface of the semiconductor base 11.

The first film member 76 is formed only on a region in which the first photodiode PD1 and the second photodiode PD2 are formed. Further, the second film member 36 is formed to cover a region on the depletion layer that extends in the interface with the p-well 44 around the contact section 41, and a region that is not covered with the first film member including the inter-pixel region 30, and a region on the first film member 51. Moreover, the bottom electrode 31 and the contact plug 34 are formed inside the second film member 36. Further, the light blocking layer 35 is formed in the inter-pixel region 30 in the second film member 36.

The first film member 76 is configured of a semiconductor material that has a band gap larger than that of the semiconductor base 11. Examples of the semiconductor material that has a large band gap may include a semiconductor material that includes silicon-carbide-based mixed crystal, ZnCdSe-based mixed crystal, AlGaInN-based mixed crystal, AlGaInP-based mixed crystal, etc. By using the semiconductor material that has a large band gap as the first film member 76, it is possible to decrease probability of generation of dark current as with the hole accumulation layer induced by the film having the negative fixed charge. Accordingly, by forming, on the photodiode PD, the first film member 76 made of the semiconductor material that has a large band gap, it is possible to suppress dark current from the interface of the semiconductor base 11.

[11. Ninth Embodiment of Solid-State Imaging Device]

Next, a ninth embodiment of the solid-state imaging device is described. It is to be noted that the ninth embodiment described below has a configuration similar to that in the first embodiment described above except for a shape of the second surface side of the semiconductor base 11 and a configuration of film members. Accordingly, in the description below of the ninth embodiment, a configuration similar to that in the first embodiment is designated with the same numeral and description thereof is omitted.

[Film Member]

A configuration of a solid-state imaging device of a ninth embodiment is illustrated in FIG. 18. In the solid-state imaging device illustrated in FIG. 18, an embedded-type element separation section 77 is formed on the second surface side of the semiconductor base 11. Moreover, a first film member 78 and a second film member 79 are formed on the back surface of the semiconductor base 11.

The element separation section 77 is configured of a groove (a trench) formed by etching the semiconductor base 11 as with STI, and the first film member 78 and the second film member 79 filling the trench. Moreover, the element separation section 77 is formed on a side surface around the vertical transfer path 40, and is formed at a position to be in contact with the vertical transfer path 40. Further, the element separation section 77 is formed from the second surface side of the semiconductor base 11 to a depth that is over the contact section 41 and the potential barrier section 42.

The element separation section 77 is formed from an outer side of outer periphery of the charge accumulation section 43 to an inner side of the outer periphery of the charge accumulation section 43. The element separation section 77 is formed so that the side surface of the contact section 41 and the potential barrier section 42 and the side surface of the upper portion of the charge accumulation section 43 are in contact with the element separation section 77. Further, the element separation section 77 is formed so that portion other than a surface in contact with the vertical transfer path 40 is in contact with the p-well 44 around the vertical transfer path 40. In other words, there is achieved a configuration in which the vertical transfer path 40 is exposed from the side surface on the inner periphery side of the element separation section 77, and the p-well 44 is exposed from the side surface on the inner periphery side to the side surface of the trench.

The first film member 78 is formed on a region in which the first photodiode PD1 and the second photodiode PD2 are formed. Further, the first film member 78 is formed on the p-well 44 that is exposed to the inner surface of the trench in the element separation section 77. The first film member 78 may be preferably configured of a film having a negative fixed charge. The film having the negative fixed charge may be made of the material described above in the first embodiment.

The second film member 79 is formed to cover a region that is not covered with the first film member 78, and a region on the first film member 78. Specifically, the second film member 79 is formed on a region on the contact section 41, on a region on the contact section 41, the potential barrier section 42, and the charge accumulation section 43 exposed to the side surface of the trench, and on a region that is not covered with the first film member 78 including the inter-pixel region 30. Further, the second film member 79 is formed to fill the entire trench in the element separation section 77.

Moreover, a material that is typically used as an interlayer insulating film of wiring layers in a semiconductor unit may be applied as the second film member 79. In particular, an insulating film formed of a material that has a small interface state and formed by a method that has a small interface state, for example an oxide film formed as a result of reaction with Si or the like may be preferably arranged. The bottom electrode 31, the contact plug 34, and the light blocking layer 35 are formed inside the second film member 79. Further, the second film member 79 has a configuration similar to that of the second film member in the first embodiment described above, except for that the second film member 79 fills the trench configuring the element separation section 77.

In the above-described configuration, there is formed the first film member 78 that is configured, of the film having the negative fixed value on the semiconductor base 11 in the region in which the photodiode PD is formed and on the p-well 44 in the trench. By providing the film having the negative fixed charge on the photodiode PD, it is possible to suppress dark current from the interface of the semiconductor base 11. Moreover, in the p-well 44 exposed to the inner surface of the trench, dark current may be generated as a result of insufficiency of the impurity in this interface. Accordingly, by forming the film having the negative fixed charge on the p-well 44 in the trench, it is possible to suppress dark current from the interface of the element separation section 77.

Moreover, by providing the element separation section 77, the conjunction area of the p-n junction in the contact section 41 is reduced. Accordingly, it is possible to suppress leakage current. Moreover, the first film member 78 is not arranged around the contact section 41 and in the inter-pixel region 30. By adopting such a configuration, suppression of dark current, suppression of color mixture, etc. are achieved.

It is to be noted that, in the above-described embodiment, the first film member configured of the film having the negative fixed charge is formed as a single layer. However, for example, as in the third embodiment or the fourth embodiment described above, the first film member may be formed of a multi-layer film. Further, the first film member may be configured, instead of the film having the negative fixed charge, of the transparent electrode described above in the seventh embodiment, or the material that has a large band gap described in the eighth embodiment. Moreover, as in the fourth embodiment or the seventh embodiment described above, there may be adopted a configuration in which the film having the negative fixed charge, the conductive layers, etc. are formed on the contact section 41 and on the inner surface of the trench to which the vertical transfer path 40 is exposed. Also in a case of adopting such a configuration, an effect achieved by the configuration in each of the embodiments is achievable in addition to the effect of the ninth embodiment described above.

[12. Tenth Embodiment of Solid-State Imaging Device]

Next, a tenth embodiment of the solid-state imaging device is described. It is to be noted that the tenth embodiment described below has a configuration similar to those in the first embodiment and the ninth embodiment described above except for a configuration of film members on the back surface of the semiconductor base 11. Accordingly, in the description below of the tenth embodiment, a configuration similar to those in the first embodiment and the ninth embodiment is designated with the same numeral and description thereof is omitted.

[Film Member]

A configuration of a solid-state imaging device of the tenth embodiment is illustrated in FIG. 19. In the solid-state imaging device illustrated in FIG. 19, a first film member 81, a second film member 82, a third film member 83, and a fourth film member 87 are formed on the back surface of the semiconductor base 11. The first film member 81 is formed on a region in which the first photodiode PD1 and the second photodiode PD2 are formed, and on the p-well 44 that is exposed from the side surface of the trench in the element separation section 77. The second film member 82 is formed on the contact section 41 and on the contact section 41, the potential barrier section 42, and the charge accumulation section 43 that are exposed from the side surface of the trench. The third film member 83 is formed on the semiconductor base 11 in the inter-pixel region 30. Further, the fourth film member 87 is formed on the first film member 81, the second film member 82, and the third film member 83, and is formed to fill in the trench of the element separation section 77.

The first film member 81 may be preferably configured of a film having a negative fixed charge. The film having the negative fixed charge may be made of a material described above in the first embodiment. The second film member 82 may be preferably configured of a film having a negative fixed charge, as with the first film member 81. However, the second film member 82 may be preferably made of a material that has a negative fixed charge amount that is smaller than that of the first film member 81. By selecting such a film having the negative fixed charge for the second film member 82, it is possible to suppress dark current in the vertical transfer path 40.

The third film member 83 may be preferably configured of a film having a negative fixed charge as with the first film member 81. By having the negative fixed charge, dark current from the surface of the semiconductor base 11 is suppressed. Further, by causing the third film member 83 to have a refractive index that is higher than that of the first film member 81, generation of a charge in the inter-pixel region 30 is suppressed, which makes it possible to suppress color mixture. Further, a material that is typically used as a wiring or an electrode in a semiconductor unit may be applied as the fourth film member 87.

As described above, the films having the negative fixed charges that are made of different materials are allowed to be formed in the respective regions of the region on the photodiode PD, the inter-pixel region 30, the contact section 41, and the element separation section 77. By forming the films having the negative fixed charges in all of the regions, it is possible to suppress dark current from the surface of the semiconductor base 11. Moreover, by selecting the material, the thickness, the forming method, etc. so that the negative fixed charge amount of the film member, the refractive index, etc. in the respective regions, suppression of dark current, suppression of color mixture, etc. are allowed to be achieved.

[13. Eleventh Embodiment of Solid-State Imaging Device]

Next, an eleventh embodiment of the solid-state imaging device is described. It is to be noted that the eleventh embodiment described below has a configuration similar to those in the first embodiment and the ninth embodiment described above except for a configuration of film members on the back surface of the semiconductor base 11. Accordingly, in the description below of the eleventh embodiment, a configuration similar to those in the first embodiment and the ninth embodiment is designated with the same numeral and description thereof is omitted.

[Film Member]

A configuration of a solid-state imaging device of the eleventh embodiment is illustrated in FIG. 20. In the solid-state imaging device illustrated in FIG. 20, a first film member 84, a second film member 85, and a third film member 86 are formed on the back surface of the semiconductor base 11.

The second film member 85 is formed on the contact section 41, and on the contact section 41, the potential barrier section 42, and the charge accumulation section 43 that are exposed from the side surface of the trench. Further, the first film member 84 is formed on a region in which the first photodiode PD1 and the second photodiode PD2 are formed, on the p-well 44 exposed from the side surface of the trench in the element separation section 77, and on the second film member 85. Further, the third film member 86 is formed to cover a region, on the semiconductor base 11, in which the first film member 84 is not formed, and a region on the first film member 84.

The first film member 84 may be preferably configured of a film having a negative fixed charge. The film having the negative fixed charge may be made of the material described above in the first embodiment. The second film member 85 is formed of a material that has a small interface state. For example, the second film member 85 may be configured of an oxide film formed as a result of reaction with the material of the semiconductor base 11, or the like. Further, the second film member 85 is formed to have a thickness that does not give an influence, of the first film member 84 configured of the film having the negative fixed charge, on the vertical transfer path 40. A material that is typically used as an interlayer insulating film of wiring layers in a semiconductor unit may be applied to the third film member 86.

The second film member 85 is formed on the contact section 41, and between the first film member 84 and the vertical transfer path 40 exposed to the trench side surface in the element separation section 77. In other words, due to the second film member 85, there is achieved a configuration in which the vertical transfer path 40 and the first film member 84 are not in direct contact with each other. In this configuration, the vertical transfer path 40 is not influenced by the first film member 84 configured of the film having the negative fixed charge. Accordingly, it is possible to suppress generation of dark current in the vertical transfer path 40. Further, by using the material that has a small interface state as the second film member 85, it is possible to suppress dark current from the interface of the vertical transfer path 40 covered with the second film member 85.

[14. Electronic Apparatus]

Next, description is provided of an embodiment of an electronic apparatus that includes the above-described solid-state imaging device. The above-described solid-state imaging device may be applicable, for example, to an electronic apparatus such as a camera system, a mobile phone having an imaging function, or other device having an imaging function. Examples of the camera system may include a digital camera and a video camcorder. FIG. 21 illustrates, as an example of the electronic apparatus, a schematic configuration of a case where the solid-state imaging device is applied to a camera capable of shooting a still image or a moving image.

A camera 100 in this example includes a solid-state imaging device 101, an optical system 102, a shutter unit 103, and a drive circuit 104. The optical system 102 guides incident light to a light reception sensor section of the solid-state imaging device 101. The shutter unit 103 is provided between the solid-state imaging device 101 and the optical system 102. The drive circuit 104 drives the solid-state imaging device 101. Further, the camera 100 includes a signal processing circuit 105 that processes an output signal of the solid-state imaging device 101.

The solid-state imaging device described above in any of the embodiments and the modifications is applicable to the solid-state imaging device 101. The optical system (an optical lens) 102 causes image light (incident light) from a subject to be formed as an image on an imaging surface (not illustrated) of the solid-state imaging device 101. Thus, a signal charge is accumulated in the solid-state imaging device 101 for a certain period. It is to be noted that the optical system 102 may be configured of an optical lens group that includes a plurality of optical lenses. Further, the shutter unit 103 controls a light illumination period and a light blocking period of incident light with respect to the solid-state imaging device 101.

The drive circuit 104 supplies drive signals to the solid-state imaging device 101 and the shutter unit 103. Further, the drive circuit 104 controls, with the use of the supplied drive signals, a signal output operation of the solid-state imaging device 101 to the signal processing circuit 105, and a shutter operation of the shutter unit 103. In other words, in this example, a signal transfer operation from the solid-state imaging device 101 to the signal processing circuit 105 is performed with the use of the drive signal (a timing signal) supplied from the drive circuit 104.

The signal processing circuit 105 performs various signal processes on a signal transferred from the solid-state imaging device 101. Further, the signal (a picture signal) on which the various signal processes are performed is stored in a storage medium (not illustrated) such as a memory, or is outputted to a monitor (not illustrated).

According to the electronic apparatus such as the camera 100 described above, it is possible to provide an electronic apparatus that has imaging characteristics improved by the solid-state imaging device 101.

It is to be noted that, in the semiconductor imaging device described above, the second-conductivity-type FD region and the second-conductivity-type photodiode PD region are formed in the semiconductor region of the first conductivity type, for example, of a p-type, that is formed on the semiconductor base of the second conductivity type, for example, of an n-type. However, the conductivity types of the n-type and the p-type may be opposite in the present technology. In this case, the signal charge transferred from the photoelectric conversion film to the semiconductor base is considered as a hole, and the conductivity types of the n-type and the p-type of the vertical transfer path connected to the photoelectric conversion film is made opposite.

It is to be noted that the present disclosure may also have the following configurations.

(1) A solid-state imaging device including:
a semiconductor base;
a photoelectric conversion element provided in the semiconductor base;
a photoelectric conversion film arranged on a light receiving surface side of the semiconductor base;
a contact section to which a signal charge generated in the photoelectric conversion film is read, the contact section being provided in the semiconductor base;
a first film member covering the photoelectric conversion element; and
a second film member provided on the contact section.

(2) The solid-state imaging device according to (1), wherein the second film member is provided on the semiconductor base in an inter-pixel region between the photoelectric conversion elements adjacent to each other.

(3) The solid-state imaging device according to (1), further including the third film member on the semiconductor base in an inter-pixel region between the photoelectric conversion elements adjacent to each other, the third film member being made of a material different from those of the first film member and the second film member.

(4) The solid-state imaging device according to any one of (1) to (3), wherein the first film member has a configuration in which different types of film members are laminated.

(5) The solid-state imaging device according to any one of (1) to (4), wherein the second film member is laminated on the first film member.

(6) The solid-state imaging device according to any one of (1) to (5), wherein the first film member includes at least one selected from a film having a negative fixed charge, a semiconductor material having a band gap larger than that of the semiconductor base, and a conductive layer.

(7) The solid-state imaging device according to any one of (1) to (6), wherein the second film member includes at least one selected from a film having a negative fixed charge amount smaller than that of the first film member, a film having an interface state smaller than that of the semiconductor base, and a conductive layer.

(8) The solid-state imaging device according to any one of (1) to (7), further including an embedded-type element separation section around the contact section.

(9) The solid-state imaging device according to (8), wherein the first film member is included in the element separation section.

(10) The solid-state imaging device according to (8) or (9), wherein the second film member is included in a portion, in the element separation section, that is in contact with the contact section.

(11) A solid-state imaging device including:
a semiconductor base;
a photoelectric conversion element provided in the semiconductor base;
a first film member provided on the photoelectric conversion element; and
the second film member provided on the semiconductor base in an inter-pixel region between the photoelectric conversion elements adjacent to each other.

(12) A method of manufacturing a solid-state imaging device, the method including:
a step of forming a photoelectric conversion element and a contact section in a semiconductor base;
a step of forming a first film member on the semiconductor base at a position that covers the photoelectric conversion element;
a step of forming a second film member on the semiconductor base at a position that covers the contact section; and
a step of forming a photoelectric conversion film on a light receiving surface of the semiconductor base.

(13) An electronic apparatus including:
the semiconductor unit according to any one of (1) to (10); and
a signal processing circuit configured to process an output signal of the semiconductor unit.

(14) An electronic apparatus including:
the semiconductor unit according to (11); and
a signal processing circuit configured to process an output signal of the semiconductor unit.

This application claims priority on the basis of Japanese Patent Application JP 2012-146499 filed Jun. 29, 2012 in Japan Patent Office, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging device comprising:
a semiconductor base;
a photoelectric conversion film arranged on a light receiving surface side of the semiconductor base;
a plurality of unit pixels, each of the unit pixels including:
a first photoelectric conversion element provided in the semiconductor base;
a bottom electrode;
a contact plug;
a contact section electrically connected to the bottom electrode by the contact plug, the contact section being provided in the semiconductor base;
a first film member covering the first photoelectric conversion element; and
a second film member, wherein the second film member extends between the first film member and the bottom electrode of the plurality of unit pixels.

2. The solid-state imaging device according to claim 1, wherein the second film member is provided on the semiconductor base in an inter-pixel region between the photoelectric conversion elements of adjacent unit pixels.

3. The solid-state imaging device according to claim 1, further comprising a third film member on the semiconductor base in an inter-pixel region between adjacent unit pixels, the third film member being made of a material different from those of the first film member and the second film member.

4. The solid-state imaging device according to claim 1, wherein the first film member has a configuration in which different types of film members are laminated.

5. The solid-state imaging device according to claim 1, wherein the second film member is laminated on the first film member.

6. The solid-state imaging device according to claim 1, wherein the first film member includes at least one of a film having a negative fixed charge, a semiconductor material having a band gap larger than that of the semiconductor base, and a conductive layer.

7. The solid-state imaging device according to claim 1, wherein the second film member includes at least one of a film having a negative fixed charge amount smaller than that of the first film member, a film having an interface state smaller than that of the semiconductor base, and a conductive layer.

8. The solid-state imaging device according to claim 1, further comprising an embedded-type element separation section around the contact section.

9. The solid-state imaging device according to claim 8, wherein the first film member is included in the element separation section.

10. The solid-state imaging device according to claim 8, wherein the second film member is included in a portion, in the element separation section, that is in contact with the contact section.

11. A method of manufacturing a solid-state imaging device, the method comprising:
   forming a plurality of unit pixels in a semiconductor base, each of the unit pixels including:
      a first photoelectric conversion element formed in the semiconductor base;
      a first film member covering the first photoelectric conversion element;
      a portion of a second film member that extends over the first film member of each of the plurality of unit pixels;
      a bottom electrode, wherein the second film member is between the first film member and the bottom electrode;
      a contact plug;
      a contact section electrically connected to the bottom electrode by the contact plug, the contact section being provided in the semiconductor base; and
   a step of forming a photoelectric conversion film on at least the bottom electrode of each of the unit pixels.

12. An electronic apparatus comprising:
a semiconductor unit; and
a signal processing circuit configured to process an output signal of the semiconductor unit,
the semiconductor unit including:
   a semiconductor base;
   a photoelectric conversion film arranged on a light receiving surface side of the semiconductor base;
   a plurality of unit pixels, each of the unit pixels including:
      a first photoelectric conversion element provided in the semiconductor base;
      a bottom electrode;
      a contact plug;
      a contact section electrically connected to the bottom electrode by the contact plug, the contact section being provided in the semiconductor base;
      a first film member covering the first photoelectric conversion element; and
   a second film member, wherein the second film member extends between the first film member and the bottom electrode of the plurality of unit pixels.

* * * * *